United States Patent
Yamazaki et al.

(10) Patent No.: US 7,375,401 B2
(45) Date of Patent: May 20, 2008

(54) STATIC RANDOM ACCESS MEMORY USING THIN FILM TRANSISTORS

(75) Inventors: Shunpei Yamazaki, Tokyo (JP); Akiharu Miyanaga, Kanagawa (JP); Jun Koyama, Kanagawa (JP); Takeshi Fukunaga, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 136 days.

(21) Appl. No.: 11/151,290

(22) Filed: Jun. 14, 2005

(65) Prior Publication Data

US 2005/0230755 A1    Oct. 20, 2005

Related U.S. Application Data

(60) Division of application No. 10/647,539, filed on Aug. 26, 2003, now Pat. No. 6,909,148, which is a division of application No. 10/077,141, filed on Feb. 15, 2002, now Pat. No. 6,611,022, which is a division of application No. 09/409,949, filed on Sep. 30, 1999, now Pat. No. 6,396,105, which is a continuation of application No. 08/803,693, filed on Feb. 24, 1997, now abandoned.

(30) Foreign Application Priority Data

Feb. 23, 1996  (JP)  ................... 8-061891
Feb. 23, 1996  (JP)  ................... 8-061892

(51) Int. Cl.
*H01L 29/76*   (2006.01)
*H01L 29/94*   (2006.01)
*H01L 31/00*   (2006.01)

(52) U.S. Cl. ............... 257/379; 257/904; 257/E27.098; 257/E21.661

(58) Field of Classification Search ................ 257/368, 257/379, 903, 904, E27.098, E21.661
See application file for complete search history.

(56) References Cited

U.S. PATENT DOCUMENTS 4,907,053 A    3/1990  Ohmi (Continued)

FOREIGN PATENT DOCUMENTS

EP    0 480 635    4/1992

(Continued)

OTHER PUBLICATIONS

Takahashi, et al., "Oxide-semiconductor interface roughness and electrical properties of polycrystalline silicon thin-film transistors", Appl. Phys. Lett., vol. 64, No. 17, pp. 2273-2275, Apr. 25, 1994.

(Continued)

*Primary Examiner*—Ngân V. Ngô
(74) *Attorney, Agent, or Firm*—Fish & Richardson P.C.

(57) ABSTRACT

A semiconductor thin film is formed having a lateral growth region which is a collection of columnar or needle-like crystals extending generally parallel with a substrate. The semiconductor thin film is illuminated with laser light or strong light having equivalent energy. As a result, adjacent columnar or needle-like crystals are joined together to form a region having substantially no grain boundaries, i.e., a monodomain region which can substantially be regarded as a single crystal. A semiconductor device is formed by using the monodomain region as an active layer.

24 Claims, 14 Drawing Sheets

U.S. PATENT DOCUMENTS

| | | | |
|---|---|---|---|
| 5,042,918 A | 8/1991 | Suzuki | |
| 5,274,485 A | 12/1993 | Narita et al. | |
| 5,294,821 A | 3/1994 | Iwamatsu | |
| 5,341,028 A | 8/1994 | Yamaguchi et al. | |
| 5,359,219 A | 10/1994 | Hwang | |
| 5,444,282 A | 8/1995 | Yamaguchi et al. | |
| 5,488,243 A | 1/1996 | Tsuruta et al. | |
| 5,492,843 A | 2/1996 | Adachi et al. | |
| 5,506,802 A | 4/1996 | Kiyono | |
| 5,508,765 A | 4/1996 | Nakagawa et al. | |
| 5,529,937 A | 6/1996 | Zhang et al. | |
| 5,543,352 A | 8/1996 | Ohtani et al. | |
| 5,550,070 A | 8/1996 | Funai et al. | |
| 5,581,102 A | 12/1996 | Kusumoto | |
| 5,608,232 A | 3/1997 | Yamazaki et al. | |
| 5,616,944 A | 4/1997 | Mizutani et al. | |
| 5,639,698 A | 6/1997 | Yamazaki et al. | |
| 5,643,801 A | 7/1997 | Ishihara et al. | |
| 5,643,826 A | 7/1997 | Ohtani et al. | |
| 5,654,573 A | 8/1997 | Oashi et al. | |
| 5,670,812 A | 9/1997 | Adler et al. | |
| 5,686,736 A * | 11/1997 | Natsume | 257/69 |
| 5,696,003 A | 12/1997 | Makita et al. | |
| 5,821,562 A | 10/1998 | Makita et al. | |
| 5,837,619 A | 11/1998 | Adachi et al. | |
| 5,843,225 A | 12/1998 | Takayama et al. | |
| 5,882,960 A | 3/1999 | Zhang et al. | |
| 5,895,933 A | 4/1999 | Zhang et al. | |
| 5,897,347 A | 4/1999 | Yamazaki et al. | |
| 5,923,962 A | 7/1999 | Ohtani et al. | |
| 5,949,706 A * | 9/1999 | Chang et al. | 365/156 |
| 5,956,579 A | 9/1999 | Yamazaki et al. | |
| 5,982,002 A | 11/1999 | Takasu et al. | |
| 6,071,764 A | 6/2000 | Zhang et al. | |
| 6,077,758 A | 6/2000 | Zhang et al. | |
| 6,084,247 A | 7/2000 | Yamazaki et al. | |
| 6,093,935 A | 7/2000 | Kusumoto | |
| 6,093,937 A | 7/2000 | Yamazaki et al. | |
| 6,107,639 A | 8/2000 | Yamazaki et al. | |
| 6,162,667 A | 12/2000 | Funai et al. | |
| 6,285,042 B1 | 9/2001 | Ohtani et al. | |
| 6,323,072 B1 | 11/2001 | Yamazaki et al. | |
| 6,335,541 B1 | 1/2002 | Ohtani et al. | |
| 6,338,991 B1 * | 1/2002 | Zhang et al. | 438/162 |
| 6,455,401 B1 | 9/2002 | Zhang et al. | |
| 6,479,331 B1 * | 11/2002 | Takemura | 438/153 |
| 6,683,350 B1 | 1/2004 | Kusumoto | |
| 6,693,324 B2 * | 2/2004 | Maegawa et al. | 257/347 |
| 6,790,749 B2 * | 9/2004 | Takemura et al. | 438/486 |
| 6,872,605 B2 * | 3/2005 | Takemura | 438/151 |
| 6,882,006 B2 * | 4/2005 | Maeda et al. | 257/329 |
| 6,924,213 B2 | 8/2005 | Zhang et al. | |
| 7,011,993 B2 | 3/2006 | Kusumoto | |
| 7,056,775 B2 | 6/2006 | Zhang et al. | |
| 7,109,108 B2 * | 9/2006 | Takemura et al. | 438/630 |
| 2003/0006414 A1 * | 1/2003 | Takemura et al. | 257/72 |
| 2005/0003568 A1 * | 1/2005 | Yamazaki et al. | 438/30 |
| 2005/0020006 A1 * | 1/2005 | Zhang et al. | 438/232 |
| 2005/0037549 A1 * | 2/2005 | Takemura et al. | 438/164 |
| 2005/0104065 A1 * | 5/2005 | Yamazaki et al. | 257/57 |
| 2005/0224796 A1 * | 10/2005 | Zhang et al. | 257/59 |
| 2005/0242405 A1 * | 11/2005 | Hashimoto et al. | 257/393 |
| 2006/0091386 A1 | 5/2006 | Kusumoto | |

FOREIGN PATENT DOCUMENTS

| | | |
|---|---|---|
| EP | 0 651 431 A2 | 5/1995 |
| JP | 61-125150 | 6/1986 |
| JP | 64-035959 | 2/1989 |
| JP | 04-147629 | 5/1992 |
| JP | 06-132218 | 5/1994 |
| JP | 06-232059 | 8/1994 |
| JP | 06-232158 | 8/1994 |
| JP | 06-244103 | 9/1994 |
| JP | 07-094757 | 4/1995 |
| JP | 07-099324 | 4/1995 |
| JP | 07-162002 | 6/1995 |
| JP | 07-182506 | 7/1995 |
| JP | 07-192998 | 7/1995 |
| JP | 07-297122 | 11/1995 |
| JP | 07-297125 | 11/1995 |
| JP | 07-321339 | 12/1995 |
| JP | 08-008218 | 1/1996 |
| JP | 08-017741 | 1/1996 |
| JP | 08-255916 | 10/1996 |
| KR | 1995-0004453 | 2/1995 |
| KR | 1995-0012580 | 5/1995 |
| KR | 1995-0021668 | 7/1995 |
| KR | 1995-0021777 | 7/1995 |
| KR | 1997-0063763 | 9/1997 |

OTHER PUBLICATIONS

Cao, et al., "A Low Thermal Budget Polysilicon Thin Film Transistor Using Chemical Mechanical Polishing", Internal Display Research Conference, pp. 294-297, Oct. 1994.

Shimokawa, et al., "Characterization of High-Efficiency Cast-Si Solar Cell Wafers by MBIC Measurement", Japanese Journal of Applied Physics, vol. 27, No. 5, pp. 751-758, May 1988.

Wolf, S., et al. "Silicon Processing for the VLSI Era vol. 1: Process Technology", Lattice Press, Sunset Beach, CA, pp. 61-65, 335, 1986.

Wolf, S., "Silicon Processing for the VLSI Era vol. 3: The Submicron MOSFET", Sunset Beach, CA, p. 648, 1995.

Wolf, S., et al. "Silicon Processing for the VLSI Era vol. 1: Process Technology", Lattice Press, Sunset Beach, CA, pp. 61-65, 335, no date available.

Wolf, S., "Silicon Processing for the VLSI Era vol. 3: The Submicron MOSFET", Sunset Beach, CA, p. 648, no date available.

* cited by examiner

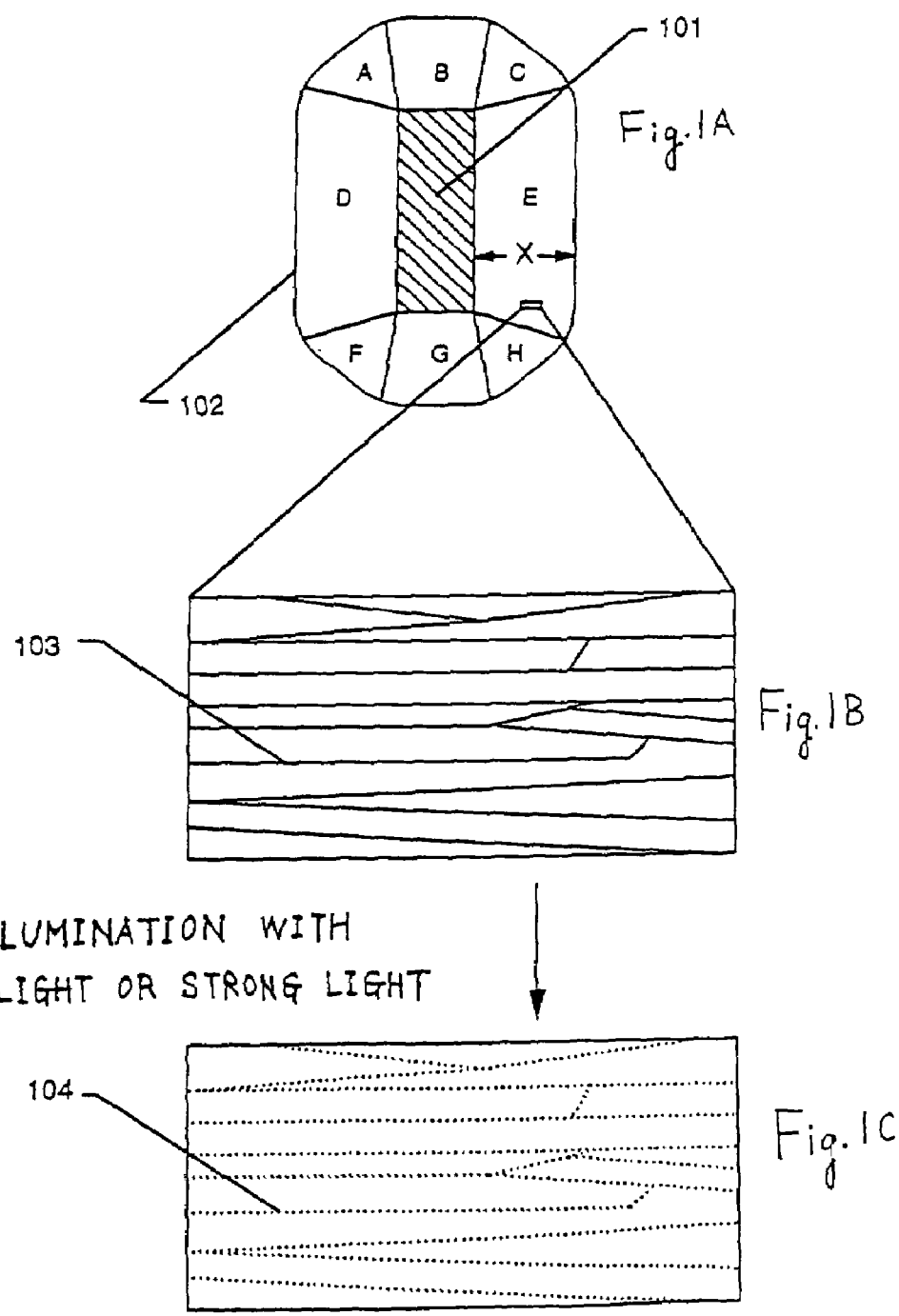

HEAT TREATMENT FOR CRYSTALLIZATION

ILLUMINATION WITH LASER LIGHT OR STRONG LIGHT

P ION IMPLANTATION

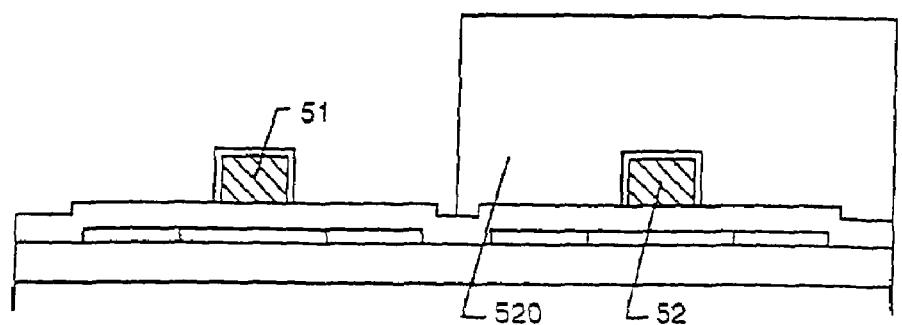
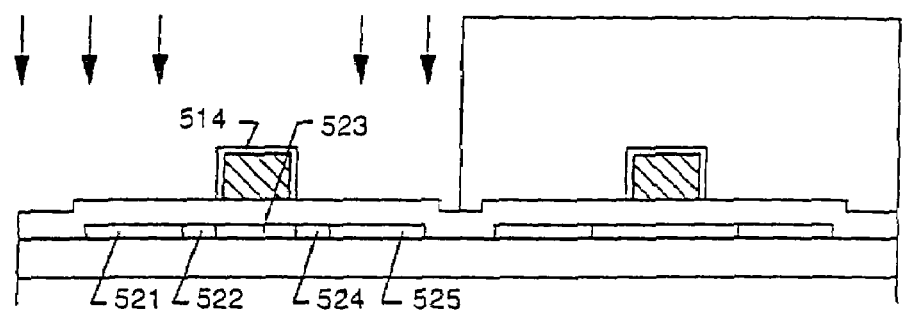
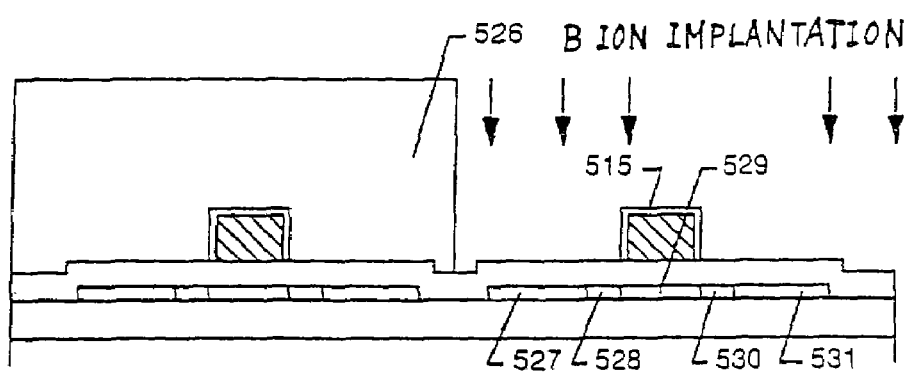
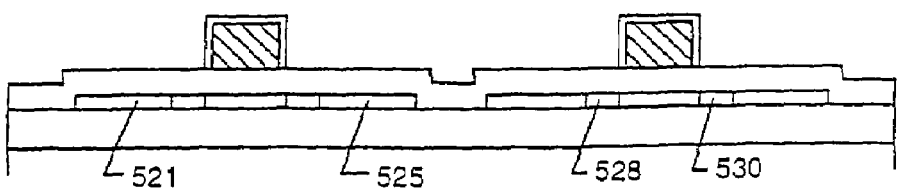

NTFT    PTFT

Fig. 12

| ELE-MENT | CONCENTRATION (ppm) | ELE-MENT | CONCENTRATION (ppm) |
|---|---|---|---|
| Fe | 0.045 | Ca | 0.16 |
| Ni | 0.016 | Mn | <0.001 |
| Na | >0.005 | Al | 0.004 |
| K | >0.004 | U [2] | <0.000031 |
| Ti | <0.05 | Tr [2] | <0.00015 |
| Mg | >0.005 | F [3] | 310 |
| Cu | 0.009 | Cl [2] | <0.73 |
| Cr | 0.003 | OH [4] | ND |

MEASUREMENT METHOD: POLARIZED ZEEMAN FLAMELESS ATOMIC ABSORPTION

NOTES) [1] ... ICP EMISSION ANALYSIS

[2] ... RADIOACTIVATION ANALYSIS

[3] .. EPMA

[4] ... INFRARED ABSORPTION

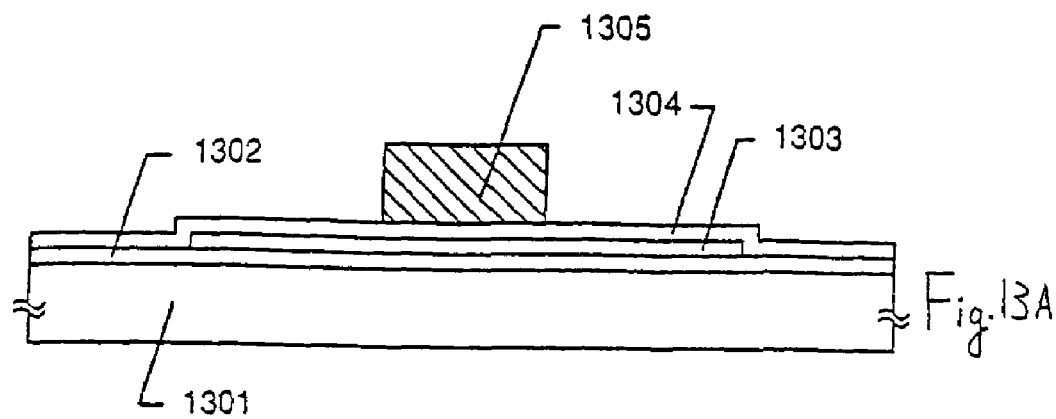
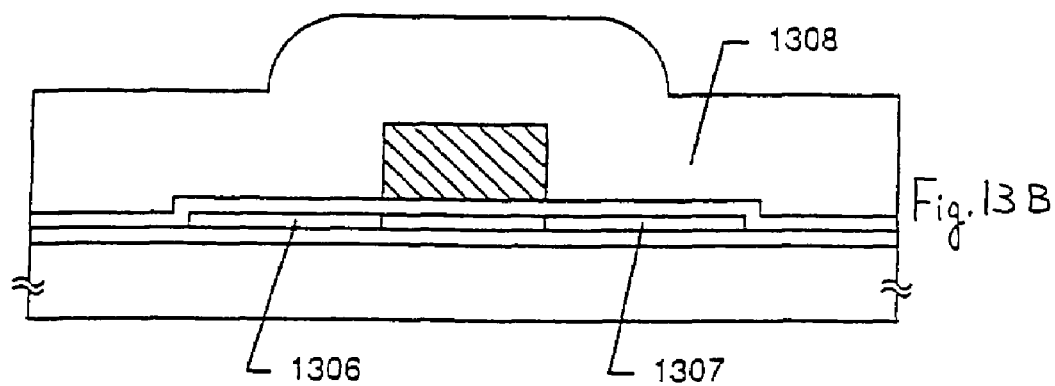
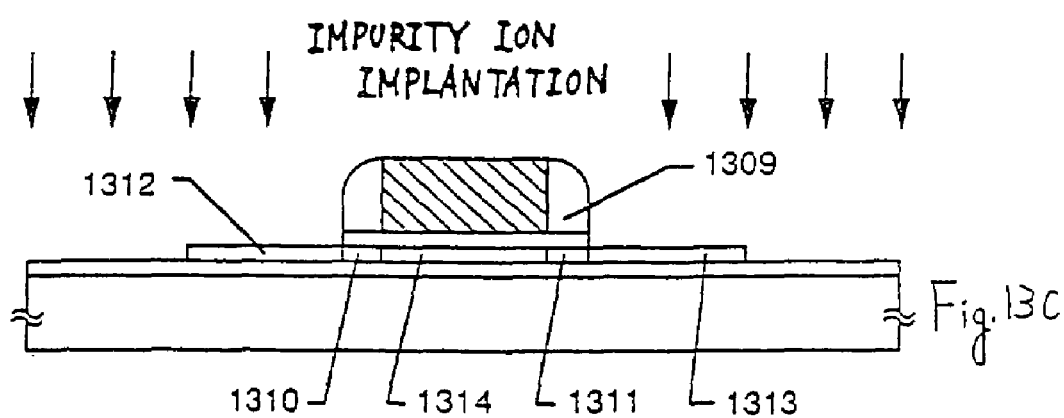
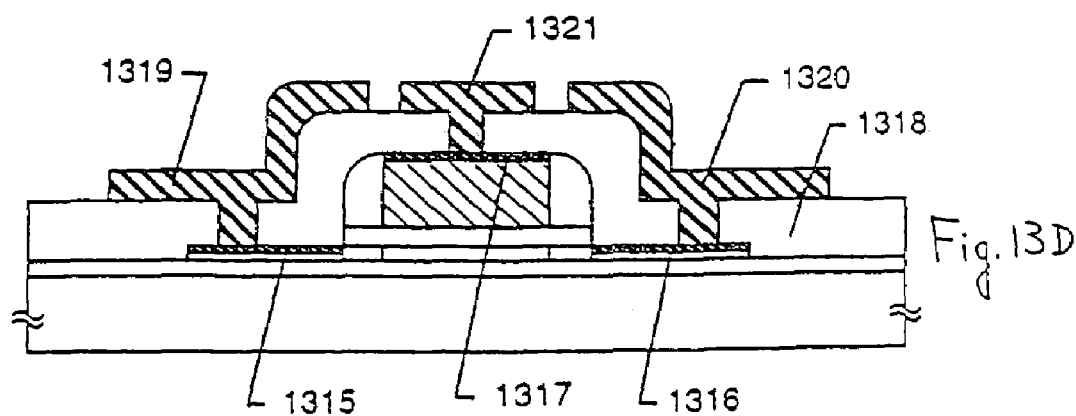

STATIC RANDOM ACCESS MEMORY USING THIN FILM TRANSISTORS

CROSS-REFERENCE TO RELATED APPLICATIONS

This application is a divisional application of U.S. application Ser. No. 10/647,539, filed Aug. 26, 2003, now U.S. Pat. No. 6,909,148, which is a divisional of U.S. application Ser. No. 10/077,141, filed Feb. 15, 2002, now U.S. Pat. No. 6,611,022, which is a divisional of U.S. application Ser. No. 09/409,949, filed Sep. 30, 1999, now U.S. Pat. No. 6,396,105, which is a continuation of U.S. application Ser. No. 08/803,693, filed Feb. 24, 1997, now abandoned, which claims the benefit of foreign priority applications filed in Japan as Ser. No. 08-061891 and Ser. No. 08-061892 on Feb. 23, 1996. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a semiconductor thin film having a region substantially regarded as a single crystal (hereinafter called "monodomain region") which is formed on a substrate having an insulating surface, and to a semiconductor device using such a semiconductor thin film as an active layer. In particular, the invention relates to a thin-film transistor which uses a crystalline silicon film as an active layer.

2. Description of the Related Art

In recent years, techniques of forming thin-film transistors (TFTs) by using a silicon semiconductor thin film (thickness: hundreds to thousands of angstrom) formed on a substrate having an insulating surface attracted much attention. The thin-film transistor is widely applied to various electronic devices such as ICs and liquid crystal display devices.

The most important portions, i.e., the heart, of the thin-film transistor are the channel-forming region and the junction portions between the channel-forming region and the source and drain regions. That is, it can be said that the active layer most influences the performance of the thin-film transistor.

An amorphous silicon film formed by plasma CVD or low-pressure thermal CVD is commonly used as a semiconductor thin film for constituting the active layer of a thin-film transistor.

At present, thin-film transistors using an amorphous silicon film are in practical use. However, when higher speed operation is required, a thin-film transistor using a silicon thin film having crystallinity (called a crystalline silicon film) is needed.

Examples of known techniques for forming a crystalline silicon film on a substrate are those described in Japanese Unexamined Patent Publication Nos. Hei. 6-232059 and Hei. 6-244103, which were filed by the present asignee. In the techniques described in these publications, a crystalline silicon film that is superior in crystallinity is formed by a heat treatment of 550° C. and about 4 hours by utilizing a metal element for accelerating crystallization of silicon.

Further, Japanese Unexamined Patent Publication No. Hei. 7-321339 discloses a technique of causing crystal growth approximately parallel with a substrate by utilizing the above-mentioned techniques. The present inventors call this type of crystallized region a lateral growth region.

A lateral growth region formed by the above technique is a collection of columnar or needle-like crystals that are arranged in the same direction, and hence is superior in crystallinity. It is known that a thin-film transistor whose active layer is formed by using this type of region exhibits high performance.

However, the above technique is still insufficient for formation of thin-film transistors to constitute various arithmetic circuits, memory circuits, etc. This is because the crystallinity is still not sufficiently high to provide the necessary characteristics.

For example, peripheral circuits of an active matrix liquid crystal display device or a passive liquid crystal display device include driver circuits for driving pixel TFTs in the pixel area, a circuit handling or controlling a video signal, a storage circuit for storing various types of information, and other circuits.

Among those circuits, the circuit for handling or controlling a video signal and the storage circuit for storing various types of information are required to have performance equivalent to that of an integrated circuit formed on a known single crystal wafer. Therefore, to integrate the above circuits by using a thin-film semiconductor formed on a substrate, it is necessary to form on a substrate a crystalline silicon film whose crystallinity is equivalent to that of a single crystal.

SUMMARY OF THE INVENTION

An object of the invention is to form, on a substrate having an insulating surface, a monodomain region whose crystallinity is equivalent to that of a single crystal. A further object of the invention is to provide a semiconductor device whose active layer is constituted by such a monodomain region.

According to one aspect of the invention, there is provided a semiconductor thin film formed on a substrate having an insulating surface, said semiconductor thin film comprising a monodomain region having crystallinity that has been improved by illumination with laser light or strong light having equivalent energy thereto, the monodomain region being a collection of columnar or needle-like crystals extending generally parallel with the substrate.

According to another aspect of the invention, there is provided a semiconductor device which uses only the above monodomain region as an active layer. The monodomain region has a feature that it has substantially no grain boundaries.

According to a further aspect of the invention, there is provided a semiconductor device manufactured by a process comprising the steps of forming an amorphous silicon film on a substrate having an insulating surface by low-pressure thermal CVD; selectively forming a silicon oxide film on the amorphous silicon film; holding a metal element for accelerating crystallization of silicon adjacent to the amorphous silicon film: performing a heat treatment to convert at least part of the amorphous silicon film into a crystalline silicon film; removing the silicon oxide film; and illuminating the amorphous silicon film and/or the crystalline silicon film with laser light or strong light having equivalent energy thereto, to convert the crystalline silicon film into a monodomain region. The semiconductor device has an active layer that is constituted of only the monodomain region.

The present inventors define, as a monodomain region, a region which is obtained according to the invention by converting a lateral growth region and can substantially be regarded as a single crystal. The monodomain region has features that it contains substantially no grain boundaries and has almost no crystal defects such as dislocations and stacking faults.

"Substantially no grain boundaries" means that grain boundaries are electrically inactive even if they exist. There have been found, as examples of such electrically inactive grain boundaries, a {111} twin crystal grain boundary, a {111} stacking fault, a {221} twin crystal grain boundary, a {221} twist twin grain boundary, etc. (R. Simokawa and Y. Hayashi, Japanese Journal of Applied Physics, Vol. 27, pp. 751-758, 1987).

The inventors consider that it is highly possible that grain boundaries in a monodomain region are electrically inactive grain boundaries as mentioned above. That is, they are considered an inactive region which does not obstruct carrier movement electrically, even though they appear to exist.

The monodomain region, which is the most important concept of the invention, is formed by the following process.

First, as shown in FIG. 1(A), crystal growth proceeds around a region 101 only in which a metal element has been introduced. The crystal growth proceeds generally parallel with a substrate, to form columnar or needle-like crystals.

The metal element for accelerating crystallization is one or a plurality of elements selected from Fe, Co, Ni, Ru, Rh, Pd, Os, Ir, Pt, Cu, and Au. Ni (nickel) is used here as an example.

A lateral growth region 102 is formed in the above manner. For example, when a heat treatment is performed at 600° C. for about 6 hours, the lateral growth length (X in FIG. 1(A)) reaches 100-200 μm.

As shown in FIG. 1(A), the resulting lateral growth region 102 is divided into eight portions A-H, which appear as if each were a crystal grain. This is because defects such as slips occur at locations where the portions A-H collide with each other, to form crystal boundaries.

FIG. 1(B) is a schematic enlarged view showing a part of the portions A-H. As seen from FIG. 1(B), microscopically each portion of the lateral growth region is a collection of columnar or needle-like crystals. Since the columnar or needle-like crystals cluster together, each portion appears like a single crystal grain macroscopically.

Each of the columnar or needle-like crystals is a region which does not contain any grain boundaries and hence can be regarded as a single crystal, i.e., a monodomain region.

Since each crystal grows while removing impurity elements such as nickel from the inside, metal silicides are formed on the crystal surface. Thus, metal elements are segregated at grain boundaries 103 (see FIG. 1(B)).

Therefore, the state of FIG. 1(B) is a mere collection of monodomain regions. Although each portion of the lateral growth region has relatively superior crystallinity, it is not a monodomain region in itself.

To complete the invention, there is needed a step for improving the crystallinity of the lateral growth region 102. In this specification, this step is given a specific name "single-crystallization step."

Specifically, in the single-crystallization step of the invention, the crystalline silicon film obtained above is illuminated with laser light or strong light having equivalent energy.

It is desirable to use laser light emitted from an ultraviolet excimer laser. More specifically, a KrF excimer laser (wavelength: 248 mm), a XeCl excimer laser (wavelength: 308 nm), or the like may be used. Similar results can be obtained even by using strong light emitted from an ultraviolet lamp rather than laser light.

The surface of the crystalline silicon film illuminated with laser light is locally heated to a high temperature, and the silicon film is rendered in an instantaneous molten state. Actually, however, metal silicides segregated at the grain boundaries 103 between the columnar or needle-like crystals melt preferentially whereas the columnar or needle-like crystals do not melt easily.

That is, when the lateral growth region 102 shown in FIG. 1(B) is illuminated with laser light, the grain boundaries 103 preferentially melt, though instantaneously, and are then re-crystallized. In FIG. 1(C), dotted lines 104 indicate junction formed by temporary dissociation and subsequent recombination at the grain boundaries 103.

At this time, silicon lattices in the vicinity of the grain boundaries are rearranged and silicon atoms are thereby recombined in a well-matched manner. Therefore, as shown in FIG. 1(C), there remain substantially no grain boundaries in each of the portions A-H which was previously a collection of columnar or needle-like crystals as shown in FIG. 1(B).

Further, since crystal defects such as dislocations and stacking faults that previously existed in the columnar or needle-like crystals now disappear, the crystallinity of portions that were previously columnar or needle-like crystals is also improved remarkably.

At this time, the portions A-H expand in volume due to the rearrangement of silicon lattices. As a result, a phenomenon is observed that the silicon film protrudes at the grain boundaries where the portions A-H collide with each other (see FIG. 1(A)), i.e., at the peripheral portion of each monodomain region. The protrusion of the silicon film is one of the features associated with the above laser illumination step.

It is empirically known that the crystallinity in crystal grains is superior when the protrusion of a silicon film occurs at grain boundaries. However, the reason is not clear at present.

It has been found by SEM observations etc. that in case that the thickness of an amorphous silicon film is 500 Å, for instance, the height of the protrusion of a silicon film is about 500 Å.

The crystalline silicon film formed by the above process is greatly improved in crystallinity, and consists of monodomain regions whose crystallinity is equivalent to that of a single crystal.

One aspect of the invention is to form the active layer of a semiconductor device as typified by a thin-film transistor by using only a monodomain region as described above.

FIG. 4 shows active layers 404 arranged in matrix form on a substrate 401 having an insulating surface in manufacturing an active matrix liquid crystal display device.

Regions 402 indicated by broken lines are locations where regions for selective introduction of nickel existed. Reference numeral 403 indicate a location where a grain boundary formed by collision of lateral growth regions existed. The regions 402 and 403 are indicated by broken lines because they are unrecognizable after formation of the active layers 404.

As shown in FIG. 4, the active layers 404 of thin-film transistors are formed to assume a matrix form so as to avoid the nickel introduction regions and the grain boundary.

FIG. 4 is a local view, and the same things apply to all the active layers 404 formed on the substrate 401. That is, active layers of millions of thin-film transistors are formed by using only monodomain regions each containing no grain boundaries.

BRIEF DESCRIPTION OF THE DRAWINGS

FIGS. 1A to 1C illustrate how a monodomain region is formed;

FIGS. 5A-5E, 6A-6D, and 7A-7B show a manufacturing process of a semiconductor device according to a fourth embodiment of the invention;

FIG. 12 is a component table of an artificial quartz target;

FIGS. 13A-13D show a manufacturing process of a semiconductor device according to a thirteenth embodiment of the invention.

DETAILED DESCRIPTION OF THE PREFERRED EMBODIMENTS

The present invention will be hereinafter described in detail by way of embodiments.

Embodiment 1

This embodiment takes a semiconductor thin film formed on a substrate having an insulating surface as an example of a semiconductor thin film, and explains a process for converting a lateral growth region (crystalline silicon film) into a monodomain region by a means for improving the crystallinity of the former. This process will be described with reference to FIGS. 2A-2F.

The crystallizing means used in this embodiment is such that nickel as a metal element for accelerating crystallization is selectively introduced into an amorphous silicon film, to obtain a crystalline silicon film that is grown approximately parallel with a substrate. As mentioned above, this technique is described in Japanese Unexamined Patent Publication No. Hei. 7-321339.

First, a substrate 201 having an insulating surface is prepared. In this embodiment, a 3,000 Å thick silicon oxide film 202 as an undercoat film is formed on a glass substrate (or a quartz or silicon substrate) by sputtering that uses an artificial quartz target. (FIG. 12 is a reference material, which is a component table of the artificial quartz target.)

Studies of the inventors have revealed that when the amorphous silicon film is later crystallized, a resulting crystalline silicon film has better crystallinity as the undercoat film is denser. This is the reason why the silicon oxide film 202 is formed by the sputtering using an artificial quartz target.

The surface of the silicon oxide film 202 is extremely flat and smooth. For example, being less than 30 Å in height and more than 100 Å in width, respectively, asperities are hardly recognized even by an observation with AFM (atomic force microscopy).

Next, an amorphous silicon film 203 is formed at a thickness of 100-750 Å (preferably 150-450 Å) by plasma CVD, sputtering, or low-pressure thermal CVD. In the case of low-pressure thermal CVD, disilane ($Si_2H_6$), trisilane ($Si_3H_8$), or the like may be used as a film forming gas.

Forming the amorphous silicon film 203 at the above thickness not only enables effective execution of a later single-crystallization step by laser light illumination, but also allows formation of a semiconductor device having a small off-current when a resulting crystalline silicon film is used as its active layer.

In an amorphous silicon film formed by low-pressure thermal CVD, the rate of occurrence of natural nuclei in a later crystallization step is small. This is desirable for increase in lateral growth length because of a low rate of interference between individual crystals (collision of individual crystals which stops their growth).

Figure 2A:
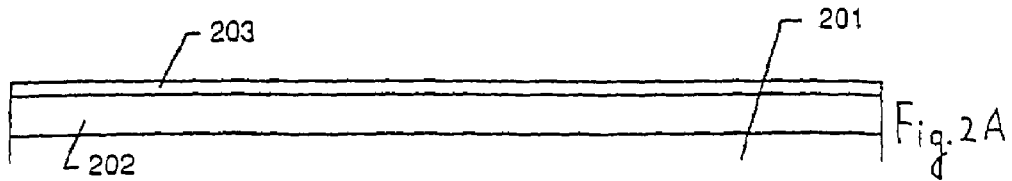
FIGS. 2A-2F show a process for forming a semiconductor thin film having a monodomain region according to a first embodiment of the present invention.

After the formation of the amorphous silicon film 203, it is illuminated with UV light in an oxygen atmosphere, whereupon a very thin oxide film (not shown) is formed on the amorphous silicon film 203 (see FIG. 2A). The oxide film is to improve the wettability of a solution in a later solution applying step for introducing nickel.

Subsequently, a silicon oxide film 204 of 500-1,200 Å in thickness is formed by sputtering that uses a quartz target, and only a portion of the oxide film 204 from which nickel is to be introduced is removed by etching. That is, the silicon oxide film 204 serves as a mask for selectively introducing nickel into the amorphous silicon film 203.

Figure 2B:
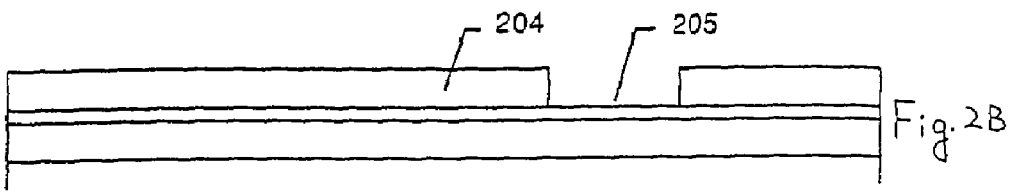

An exposed region 205 is so formed as to assume a slit that extends perpendicularly to the paper surface of FIGS. 2A-2F (see FIG. 2B).

Figure 2C:
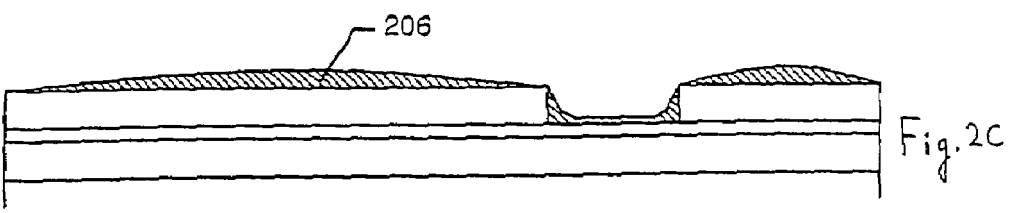
Figure 2D:
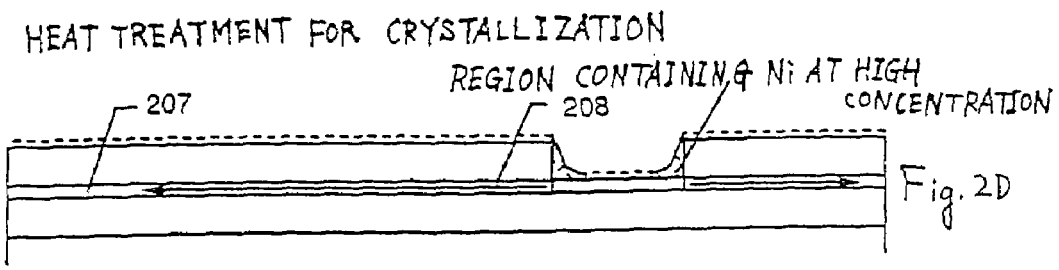
Figure 2E:
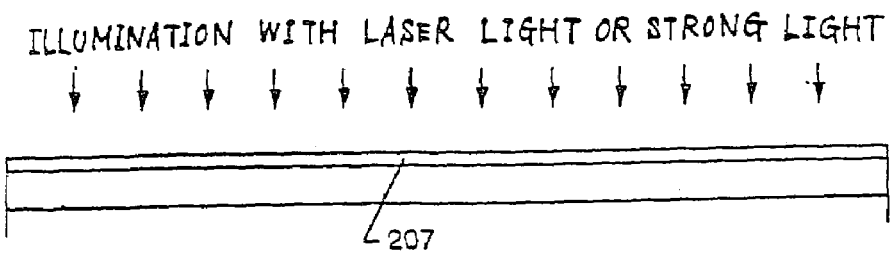
Figure 2F:
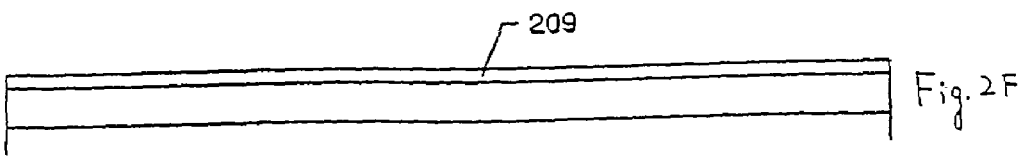

Next, a nickel acetate salt solution containing nickel at a given density is dropped to form a liquid film 206 (see FIG. 2C).

In view of residual impurities in a later heating step, it is preferred that a nickel nitrate salt solution be used as the nickel salt solution. Although a nickel acetate salt solution may also be used, carbon contained therein will remain in the film as carbides in the later heating step.

In the state of FIG. 2C, spin coating is performed with a spinner to establish a state that nickel is held adjacent to the amorphous silicon film 203 via the oxide film (not shown) in the region 205.°

After hydrogen removal is performed at 450° C. for about one hour in an inert gas atmosphere, the amorphous silicon film 203 is crystallized by performing a heat treatment at 500°-700° C., typically at 550°-600° C., for 4-8 hours. Where a glass substrate is used, it is preferred that the heat treatment be performed at lower than 650° C. in light of the heat resistance of glass. Thus, a crystalline silicon film 207 is obtained (see FIG. 2D).

Nickel, which is held adjacent to the amorphous silicon film 203 via the oxide film (not shown) in the region 205 at the beginning, diffuses into the amorphous silicon film 203 through the oxide film (not shown) and serves as a catalyst for accelerating the crystallization. More specifically, nickel reacts with silicon to produce silicides, and crystallization proceeds with the silicides acting as nuclei.

At this time, the crystal growth proceeds such that columnar or needle-like crystals are formed approximately parallel with the substrate 201. In this embodiment, since the region 205 assumes a slit extending perpendicularly to the paper surface of FIGS. 2A-2F, the crystal growth proceeds approximately in two opposite directions (along one axis) as indicated by arrow 208. Each crystal growth can proceed over more than several hundred micrometers.

If natural nuclei are generated by the heat treatment, individually grown columnar or needle-like crystals interfere with each other to stop each other's growth. This phenomenon is unfavorable because it shortens growth lengths of lateral growth regions. Therefore, it is desired to establish conditions under which most of the nuclei are the introduced nickel elements and there exist few natural nuclei.

The concentration of introduced nickel can easily be controlled by adjusting the density of the nickel salt solution in the solution application step.

Since the above lateral growth regions are arranged in the same direction, each crystal is not much influenced by other crystals. Therefore, macroscopically, the lateral growth regions look like a large crystal grain of more than several hundred micrometers in length.

However, microscopically, they are merely a collection of columnar or needle-like crystals. Although each crystal is a monodomain, the lateral growth regions, as a whole, are merely regions that are relatively high in crystallinity and cannot be regarded as a monodomain region.

Once the heating treatment for crystallization is finished, the silicon oxide film 204 that served as the mask for selectively introducing nickel is removed. This is easily done by using a buffered hydrofluoric acid or the like.

In this state, the crystalline silicon film 207 has asperities of less than ±30 Å (preferably less than ±20 Å). This is considered due to the fact that the surface of the silicon film is covered with the silicon oxide film 204 during the crystal growth.

Next, the crystalline silicon film obtained by the above step is illuminated with laser light or strong light having equivalent energy. In this embodiment, laser light emitted from a KrF excimer laser (wavelength: 248 nm) is used. Alternatively, a XeCl excimer laser (wavelength: 308 nm) may be used.

In this step, columnar or needle-like crystals that constitute lateral growth regions are locally heated to a high temperature by the illumination with laser light. At this time, metal silicides (nickel silicides in this embodiment) segregated at grain boundaries (indicated by numeral 103 in FIG. 1B) between the columnar or needle-like crystals melt first.

At grain boundaries that have melted instantaneously, silicon lattices are rearranged and silicon atoms are thereby recombined in a well-matched manner. Therefore, grain boundaries substantially disappear; the lateral growth regions themselves can be rendered a monodomain region.

Further, crystal defects such as dislocations and stacking faults which existed in columnar or needle-like crystals almost disappear, the crystallinity is much improved in the regions that were previously the columnar or needle-like regions.

The crystalline silicon film 207 thus obtained is a monodomain region having substantially no grain boundaries. In the monodomain region, the crystallinity is equivalent to that of a single crystal.

Embodiment 2

This embodiment is directed to a case where the laser light illumination in the first embodiment is replaced by illumination with strong light having equivalent energy. RTA (rapid thermal annealing) is known as a technique for this purpose.

The RTA is a method in which strong light of infrared light, ultraviolet light, or some other type of light emitted from a lamp is applied to an object to be processed. The RTA has a feature that substantially only the outermost layer of a thin film can be heated because of fast rising and falling rates of temperature and a short processing time of several seconds to tens of seconds. For example, only a thin film on a glass substrate can be annealed at an extremely high temperature of about 1,000° C.

In a manufacturing process, the short processing time means a great increase in throughput. As such, the RTA is a very effective means also in terms of productivity.

Embodiment 3

This embodiment is directed to a case of forming the active layer of a thin-film transistor by using a monodomain region obtained by the process of the first embodiment. Although this embodiment is directed to a top-gate thin-film transistor, the invention can easily be applied to a bottom-gate one.

Figure 3A:
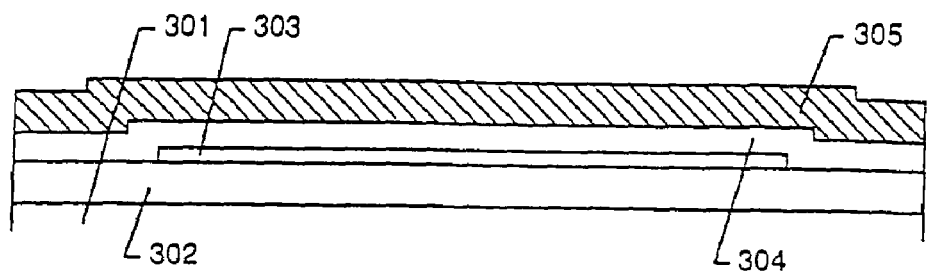
FIGS. 3A-3E show a manufacturing process of a semiconductor device according to a third embodiment of the invention.

First, as shown in FIG. 3A, a semiconductor thin film including a monodomain region is formed by the process of the first embodiment, and an active layer 303 constituted of only a monodomain region is formed by patterning. As described in the first embodiment, reference numerals 301 and 302 denote a quartz substrate and a silicon oxide film, respectively.

Next, a 1,500 Å thick silicon oxide film 304 to serve as a gate insulating film is formed by plasma CVD. Alternatively, it may be a silicon oxynitride film or a silicon nitride film.

A 5,000 Å thick aluminum film 305 to constitute a gate electrode is formed thereon by sputtering. The aluminum film 305 is caused to contain scandium at 0.2 wt %. Instead of aluminum, another metal such as tantalum or molybdenum may be used. Thus, the state of FIG. 3A is obtained.

A very thin anodic oxide film (not shown) is formed on the surface of the aluminum film 305 by using an electrolyte obtained by neutralizing an ethylene glycol solution containing tartaric acid at 3% with aqueous ammonia. In this electrolyte, the aluminum film 305 is used as the anode and platinum is used as the cathode.

A resulting dense anodic oxide film has a function of improving the adhesiveness with a later formed resist mask. The thickness of the anodic oxide film (not shown), which can be controlled by the application voltage, is set at 100 Å.

Figure 3B:
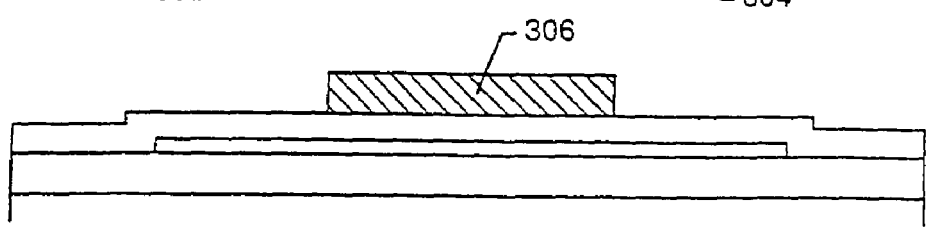

Next, the aluminum film 305 is patterned into an island-like aluminum pattern 306 from which a gate electrode will be formed. A resist mask (not shown) used in this step is left as it is (see FIG. 3B).

Figure 3C:
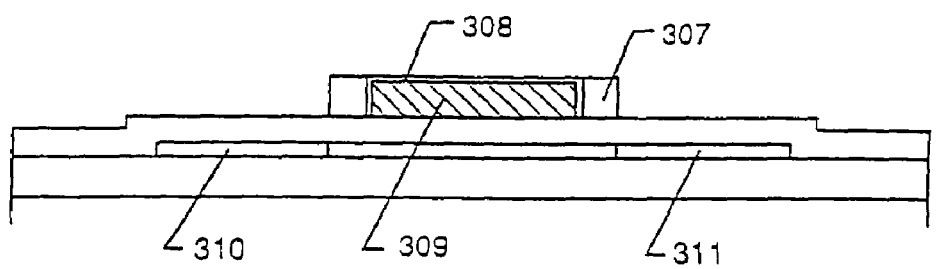

In the state of FIG. 3B, anodization is again performed with the aluminum pattern 306 used as the anode. A 3% aqueous solution of oxalic acid is used as an electrolyte. In this anodization step, because of the existence of the resist mask (not shown), anodization proceeds only on the side faces of the aluminum pattern 306, so that a porous anodic oxide film 307 is formed as shown in FIG. 3C. The porous anodic oxide film 307 is allowed to grow to a length of several micrometers.

The thickness of the porous anodic oxide film 307, which can be controlled by the anodization time, is set at 7,000 Å.

Once the porous anodic oxide film 307 is formed as shown in FIG. 3C, the resist mask (not shown) is removed. Then, anodization is again performed to form a dense anodic oxide film 308. This anodization step is performed under the same conditions as the previous dense anodic oxide film forming step.

However, this time, the dense anodic oxide film 308 is formed at a thickness of 800 Å. The anodic oxide film 308 is formed as shown in FIG. 3C because the electrolyte enters the inside of the porous anodic oxide film 307.

If the anodic oxide film 308 is made as thick as more than 1,500 Å, offset gate regions can be formed in a later impurity ions implantation step.

A portion of the aluminum pattern 306 which has not been anodized in the above anodization steps constitutes a gate electrode 309.

The dense anodic oxide film 308 will serve to suppress occurrence of hillocks on the surface of the gate electrode 309 in later steps.

In the state that the dense anodic oxide film 308 is formed, impurity ions are implanted to form source and drain regions. In this embodiment, P ions are implanted to form an n-channel thin-film transistor. Heavily doped source and drain regions 310 and 311 are formed in this step (see FIG. 3C).

Next, only the porous anodic oxide film 307 is removed by using a mixed acid of acetic acid, phosphoric acid, and nitric acid, and then P ions are implanted again at a lower dose than in the previous formation of the source and drain regions 310 and 311.

As a result, low-concentration impurity regions 312 and 313 are formed which have a lower impurity concentration than the source and drain regions 310 and 311. Further, a channel-forming region 314 is formed in a self-aligned manner (see FIG. 3D).

Then, to anneal the ion-implanted regions, laser light, infrared light, or ultraviolet light is applied.

Thus, the source region 310, low-concentration impurity region 312, channel-forming region 314, low-concentration impurity region 313, drain region 311 are formed. The low-concentration impurity region 313 is usually called an LDD (lightly doped drain) region.

It is effective to perform, in this state, plasma hydrogenation at 300°-350° C. for 0.5-1 hour. As a result of this step, hydrogen is added to the active layer 303 at less than 5 atomic % (less than $1\times10^{21}$ atoms/cm$^3$), preferably $1\times10^{15}$ to $1\times10^{21}$ atoms/cm$^3$.

Since these hydrogen atoms are active, they neutralize and eliminate dangling bonds of silicon and energy levels at the boundary between the active layer 303 and the gate insulating film 304.

Figure 3D:
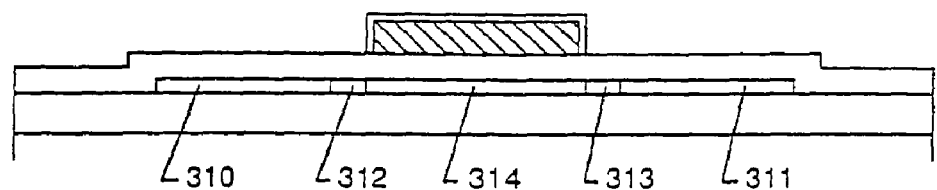

After the state of FIG. 3D is obtained in the above manner, an interlayer insulating film 315 is formed in the form of a silicon oxide film, a silicon nitride film, a silicon oxynitride film, a resin film, or a multilayer film thereof. The use of a silicon nitride film is preferable because it prevents hydrogen atoms that have been added in the preceding step from escaping from the device.

Next, contact holes are formed, and then a source electrode 316 and a drain electrode 317 are formed. In producing an active matrix liquid crystal display device, no lead-out electrode for the gate electrode 309 is needed in a pixel TFT. On the other hand, it is necessary to form a lead-out electrode for the gate electrode 309 at the same time in a TFT of peripheral driver circuits.

Figure 3E:
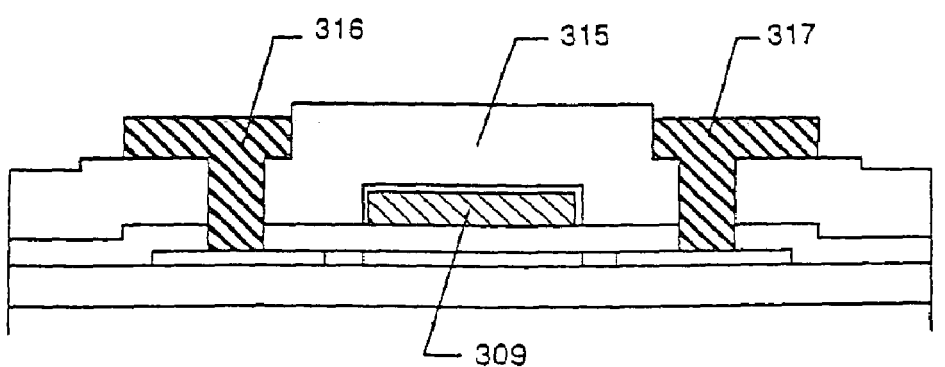
Figure 4:
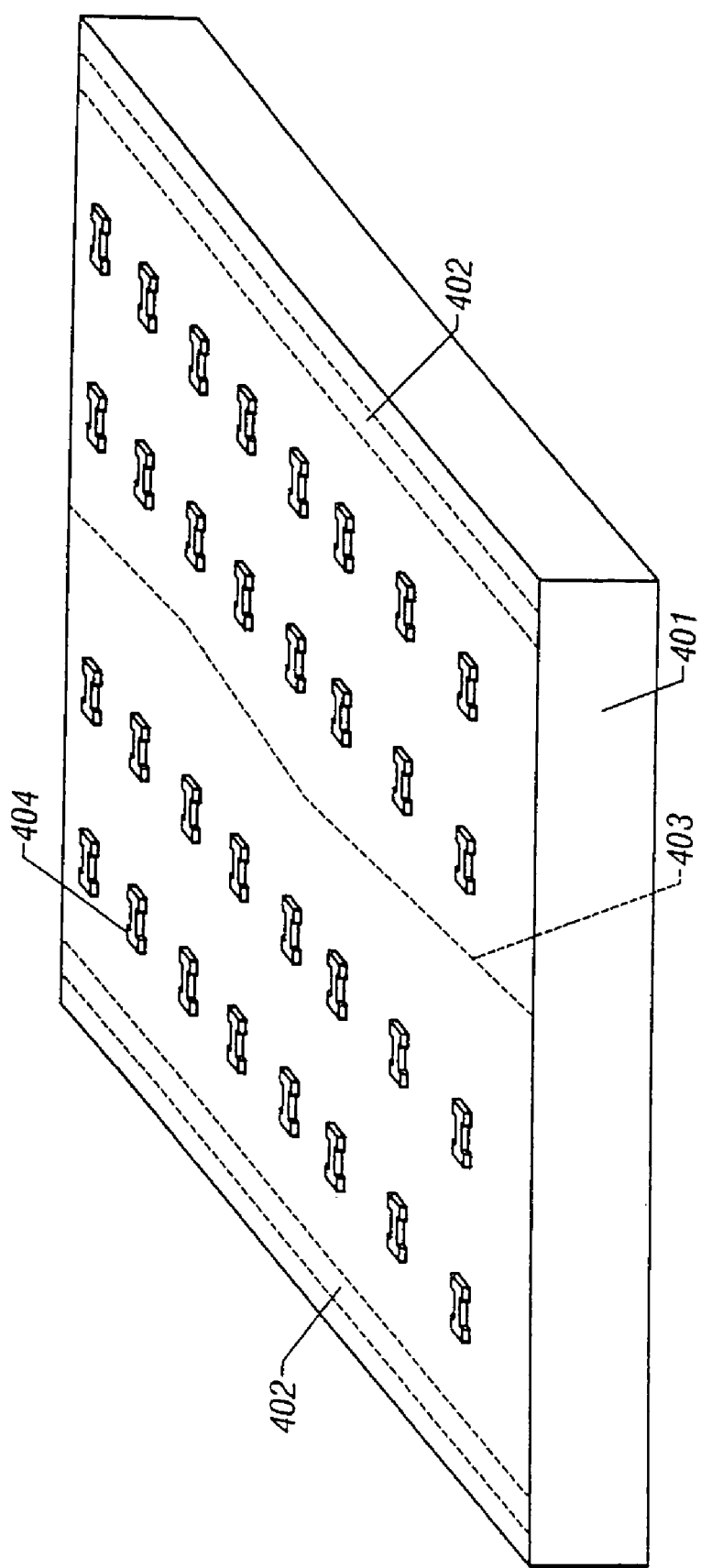
FIG. 4 shows active layers formed in monodomain regions.

Finally, the entire device is hydrogenated by performing a heat treatment at 350° C. in a hydrogen atmosphere. Thus, a thin-film transistor is completed as shown in FIG. 3E.

The resulting thin-film transistor exhibits so large an electric field mobility as to accommodate high-speed operation, because its active layer is constituted of a monodomain region. Further, since there are no grain boundaries and segregation of nickel compounds etc. in the channel region and the drain junction, the thin-film transistor is highly reliable.

Embodiment 4

This embodiment is directed to a method for forming a CMOS structure by using TFTs of the third embodiment. FIGS. 5A-5E, 6A-6D, and 7A-7B show a manufacturing process according to this embodiment. Incidentally, the application range of a crystalline silicon film formed according to the invention is wide, and the method for forming a CMOS structure is not limited to this embodiment.

First, according to the first embodiment, a silicon oxide film 502 is formed on a glass substrate 501 and a crystalline silicon film having a monodomain region is formed thereon. By patterning the crystalline silicon film, an active layer 503 for an n-channel TFT and an active layer 504 for a p-channel TFT are obtained. Each of the active layers 503 and 504 is made of only a monodomain region.

Subsequently, a silicon oxide film 509 as a gate insulating film is formed by plasma CVD at a thickness of 500-2,000 Å, typically 1,000-1,500 Å. The gate insulating film may be another type of insulating film such as a silicon oxynitride film or a silicon nitride film.

Figure 5A:
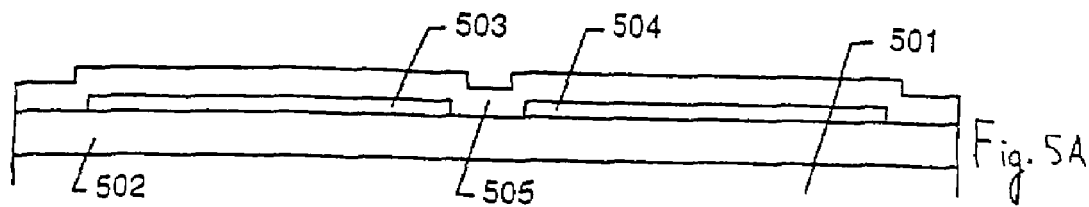

Thus, the state of FIG. 5A is obtained. To simplify the description, this embodiment will be described for the case of forming a pair of n-channel and p-channel thin-film transistors. In general, more than 100 pairs of n-channel and p-channel thin-film transistors are formed on the same glass substrate.

Figure 5B:
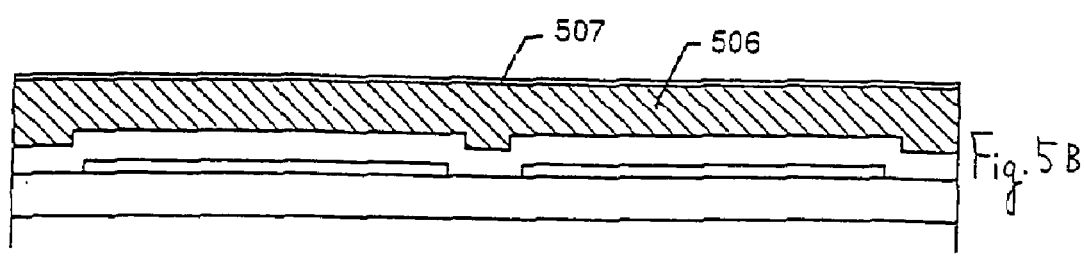

Once the state of FIG. 5A is obtained, an aluminum film 506 from which a gate electrode will be constituted is formed as shown in FIG. 5B.

To suppress occurrence of hillocks and whiskers, the aluminum film 506 is caused to contain scandium at 0.2 wt %. The aluminum film 506 is formed by sputtering or electron beam evaporation.

Hillocks and whiskers, which mean prickle or needle-like protrusions formed by abnormal growth of aluminum, may cause short-circuiting or crosstalk between adjacent wiring lines or wiring lines spaced vertically.

Instead of aluminum, another metal capable of being anodized, such as tantalum, may be used.

Once the aluminum film 506 is formed, a thin, dense anodic oxide film 507 is formed in an electrolyte with the aluminum film 506 used as the anode.

The electrolyte is one obtained by neutralizing an ethylene glycol solution containing tartaric acid at 3% with ammonia. A dense anodic oxide film can be formed by this anodization method. Its thickness can be controlled by the application voltage.

In this embodiment, the thickness of the anodic oxide film 507 is set at 100 Å. The anodic oxide film 507 has a function of improving the wettability with a later formed resist mask. Thus, the state of FIG. 5B is obtained.

Figure 5C:
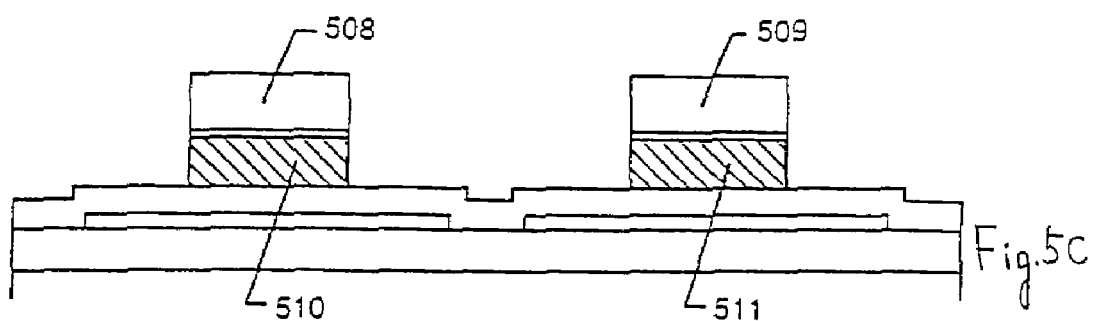

Next, resist masks 508 and 509 are formed. The aluminum film 506 and the anodic oxide film 507 are patterned by using the resist masks 508 and 509. Thus, the state of FIG. 5C is obtained.

Subsequently, anodization is performed in an electrolyte that is a 3% aqueous solution of oxalic acid with residual aluminum patterns 510 and 511 used as the anodes. In this anodization step, anodization proceeds only on the side faces of the residual aluminum films 510 and 511, because the residual portions of the anodic oxide film 507 and the resist masks 508 and 509 remain on the top surfaces of the aluminum films 510 and 511.

In this anodization step, porous anodic oxide films 512 and 513 are formed, which are allowed to grow to a length of several micrometers.

Figure 5D:
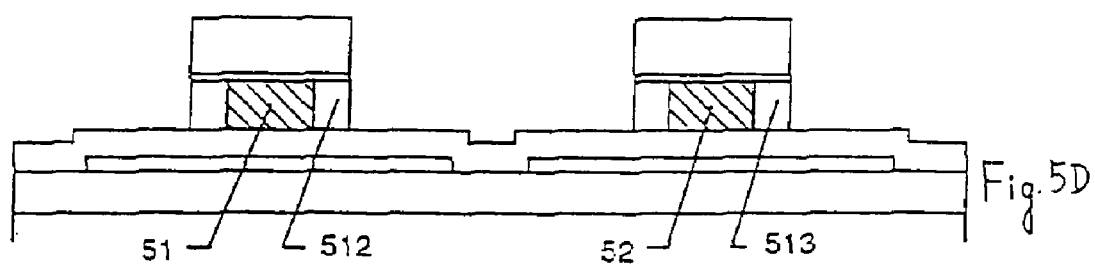

In this embodiment, the growth length of anodization, i.e., the thickness, is set at 7,000 Å. The growth length of anodization determines the length of low-concentration impurity regions that will be formed later. An empirically desirable range of the growth length of the porous anodic oxide films 512 and 513 is 6,000-8,000 Å. Thus, the state of FIG. 5D is obtained.

Gate electrodes 51 and 52 are defined in this state. Once the state of FIG. 5D is obtained, the resist masks 508 and 509 are removed.

Next, anodization is again performed which uses an electrolyte obtained by neutralizing an ethylene glycol solution containing tartaric acid at 3% with ammonia. In this step, the electrolyte enters the porous anodic oxide films 512 and 513, so that dense anodic oxide films 514 and 515 are formed as shown in FIG. 5E.

The thickness of the anodic oxide films 514 and 515, which is controlled by the voltage application time, is set at 500-4,000 Å. The residual portions of the previously formed dense anodic oxide film 507 are unified with the anodic oxide films 514 and 515, respectively.

Figure 5E:
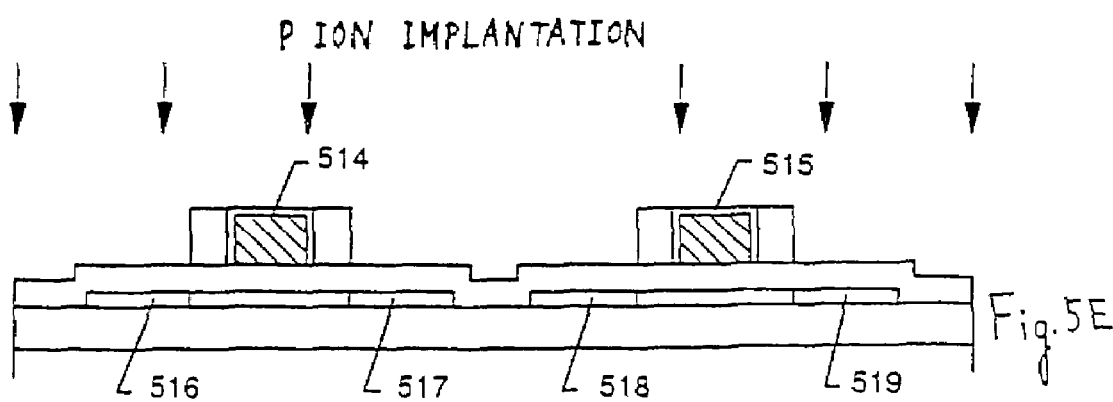

In the state of FIG. 5E, P (phosphorus) ions for imparting n-type conductivity are applied to the entire surface. This doping is performed by plasma doping or ion doping at a high dose of $0.2\text{-}5\times10^{15}$ $cm^{-2}$, preferably $1\text{-}2\times10^{15}$ $cm^{-2}$.

The step of FIG. 5E forms regions 516-519 in which P ions are implanted at a high concentration.

Next, the porous anodic oxide films 512 and 513 are removed by using an aluminum mixed acid. At this time, portions of the active layers 503 and 504 that existed right under the anodic oxide films 512 and 513 are substantially intrinsic because they were not subjected to ion implantation.

Subsequently, a resist mask 520 is so formed as to cover the right-hand p-channel thin-film transistor. Thus, the state of FIG. 6A is obtained.

In this state, P ions are again implanted as shown in FIG. 6B. The dose is set at a small value of $0.1\text{-}5\times10^{14}$ $cm^{-2}$, preferably $0.3\text{-}1\times10^{14}$ $cm^{-2}$. That is, the dose of the P-ion implantation in the step of FIG. 6B is set lower than in the step of FIG. 5E.

As a result, low-concentration impurity regions 522 and 524 are formed. Regions 521 and 525 are high-concentration impurity regions which are doped with P ions at a higher concentration.

As a result of this step, the region 521 becomes a source region of the n-channel thin-film transistor. The regions 522 and 524 become low-concentration impurity regions, and the region 525 becomes a drain region. The region designated by a reference numeral 524 is generally called an LDD (lightly doped drain) region. A region 523 becomes a substantially intrinsic channel-forming region.

Although not shown in the figures, there exist, between the channel-forming region 523 and the low-concentration impurity regions 522 and 524, regions that were prevented from being doped with ions by the anodic oxide film 514. These regions are called offset gate regions and are as long as the thickness of the anodic oxide film 514.

The offset gate regions are not doped with ions and hence are substantially intrinsic. Since a gate voltage is not applied to the offset gate regions, a channel does not develop there and they serve as resistance components for reducing electric field strength and preventing degradations.

However, if the offset gate regions are too short, they do not play the above-mentioned roles. There is no definite boundary of length above which they function effectively.

Next, after the resist mask 520 is removed, a resist mask 526 is so formed as to cover the left-hand n-channel thin-film transistor as shown in FIG. 6C.

In the state of FIG. 6C, B (boron) ions are implanted at a dose of $0.2\text{-}10\times10^{15}$ $cm^{-2}$, preferably $1\text{-}2\times10^{15}$ $cm^{-2}$. This dose value can be set approximately the same as that of the FIG. 5E step.

Although regions 527 and 531 that are formed by this step contain both n-type and p-type impurities, they substantially act as mere pads (hereinafter called contact pads) for taking contact with lead-out electrodes. That is, in contrast to the case of the left-hand n-channel thin-film transistors, the regions 527 and 531 are clearly discriminated from source and drain regions.

As for the p-channel thin-film transistor, the inventors define regions 528 and 530 as source and drain regions, respectively.

The regions 528 and 530 have been formed by implanting only B ions into a substantially intrinsic region. Since there exist no ions of the other type, the impurity concentration can easily be controlled there and hence a p-i junction can be formed in a well-matched manner. Further, the degree of disorder in crystallinity due to the ion implantation is relatively low.

Although offset gate regions can be formed by utilizing the anodic oxide film 515, there is no particular reason for forming offset regions, that is, it is empirically known that almost no degradations occur in a p-channel thin-film transistor.

The source region 528 and the drain regions 530 of the p-channel thin-film transistor are formed in the above manner. Not doped with any impurity, a region 529 becomes a channel-forming region. As mentioned above, the regions 527 and 531 become contact pads for allowing current to flow into or from the source region 528 and the drain region 530, respectively.

After completion of the step of FIG. 6C, the resist mask 526 is removed to obtain the state of FIG. 6D. In this state, laser light illumination is performed to activate the implanted impurities and anneal the impurity-ions-implanted regions.

The laser light illumination can be performed in a state that the crystallinity of the source and drain regions 521 and 525 of the n-channel thin-film transistor and that of the source and drain regions 528 and 530 of the p-channel thin-film transistor are not much different from each other. This is because the source and drain regions 528 and 530 of the p-channel thin-film transistor are not much damaged by the ion implantation of the FIG. 6C step.

Therefore, in annealing the source and drain regions of the two thin-film transistors by performing laser light illumination in the state of FIG. 6D, differences in annealing effects can be corrected. That is, differences in the characteristics of the n-channel and p-channel thin-film transistors can be corrected.Å

Figure 7A:
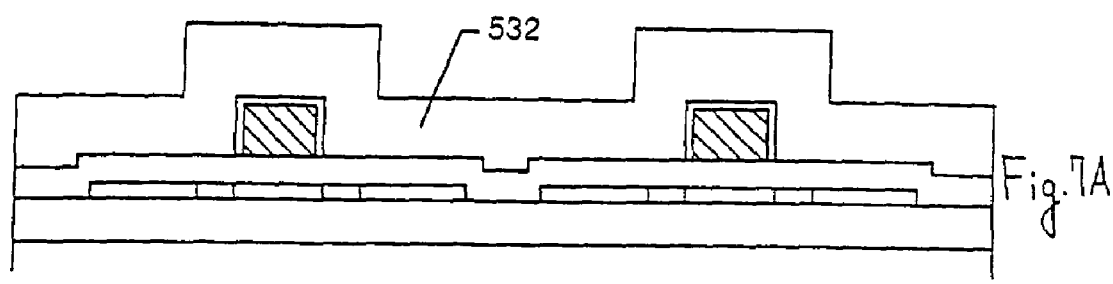
Figure 7B:
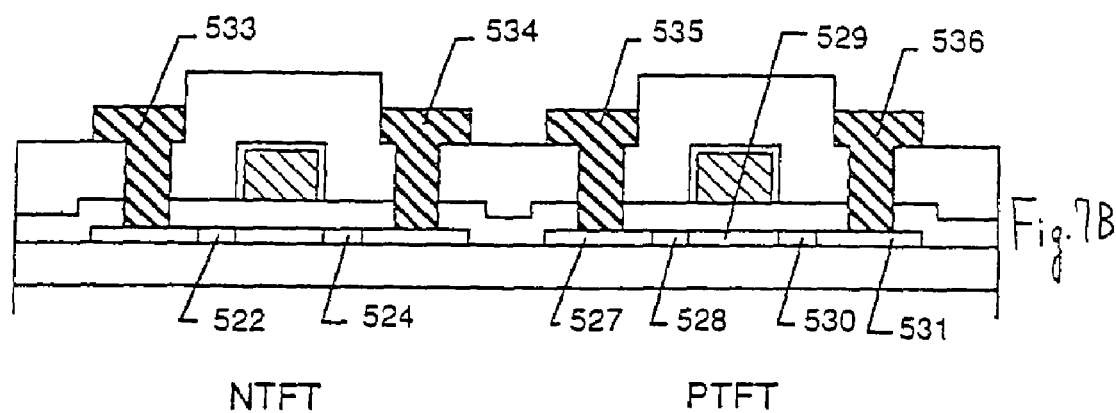

Once the state of FIG. 6D is obtained, a 4,000 Å thick interlayer insulating film 532 is formed as shown in FIG. 7A.

The interlayer insulating film 532 may be one of a silicon oxide film, a silicon oxynitride film, and a silicon nitride film, or may even assume a multilayer structure. These silicide films may be formed by plasma CVD or thermal CVD.

After contact holes are formed, a source electrode 533 and a drain electrode 534 of the n-channel thin-film transistor (NTFT) are formed. At the same time, a source electrode 535 and a drain electrode 536 of the p-channel thin-film transistor (PTFT) are formed (see FIG. 7B).

A CMOS structure is obtained by performing the patterning so that the drain electrode 534 of the n-channel thin-film transistor and the drain electrode 536 of the p-channel thin-film transistor are connected together and that the gate electrodes of the two TFTs are connected together.

For example, a CMOS thin-film circuit as described in this embodiment can be used in an active matrix liquid crystal display device and an active matrix EL display device.

In the impurity ion implantation steps of FIGS. 5E, 6B, and 6C, it is important that the active layers be covered with the silicon oxide film 505 as the gate insulating film. If impurity ions are implanted in such a state, the surface of the active layers can be prevented from being roughened or polluted. This greatly contributes to increase in yield as well as increase in the reliability of resulting devices.

Embodiment 5

This embodiment is directed to a case of forming a crystalline silicon film according to the first embodiment on a silicon wafer. In this case, it is necessary to form an insulating layer on the surface of the silicon wafer. Usually, a thermal oxidation film is formed as the insulating layer.

The common temperature range of the heat treatment is 700° C.-1,300° C., and the processing time varies depending on a desired thickness of the oxide film.

The thermal oxidation of a silicon wafer is usually performed in an atmosphere of $O_2$, $O_2$—$H_2O$, $H_2O$, or $O_2$—$H_2$ combustion. Oxidation in an atmosphere containing a halogen element in the form of HCl or $Cl_2$ is also widely employed.

The silicon wafer is one of the substrates that are indispensable for semiconductor devices such as ICs. Various techniques have been developed to form a variety of devices on a silicon wafer.

According to this embodiment, a crystalline silicon film whose crystallinity is equivalent to that of a single crystal is combined with the conventional techniques using a silicon wafer, whereby the application range of a crystalline silicon film can further be expanded.

Embodiment 6

This embodiment is an example of the fifth embodiment in which a TFT using a crystalline silicon film of this invention is formed on an IC that is formed on a silicon wafer. A manufacturing process will be outlined with reference to FIGS. 8A-8D.

Figure 8A:
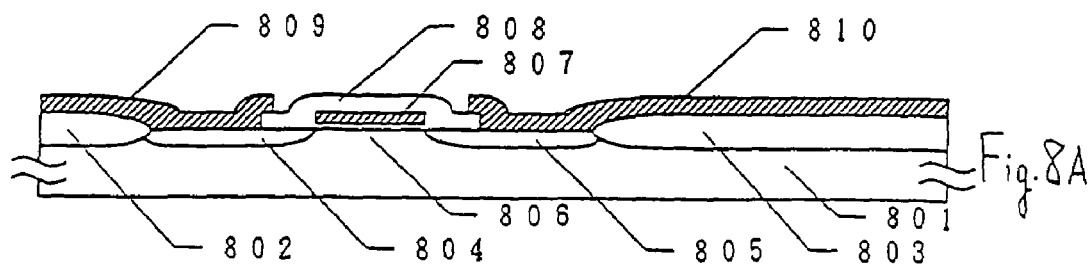
FIGS. 8A-8D show a manufacturing process of a semiconductor device according to a sixth embodiment of the invention.

FIG. 8A shows a MOS-FET formed on a silicon wafer by an ordinary process. Reference numeral 801 denotes a silicon substrate, and 802 and 803 denote insulating films for isolating devices from each other which films are usually thermal oxidation films.

A source region 804 and a drain region 805 are formed by implanting impurity ions for imparting one type of conductivity to the silicon substrate 801 and then performing a diffusion step. If the silicon substrate 801 is of a p type, an impurity (phosphorus) for imparting n-type conductivity is implanted. If the silicon substrate 801 is of an n type, an impurity (boron) for imparting p-type conductivity is implanted.

Reference numeral 806 denotes a channel-forming region. Part of the thermal oxidation film formed by the diffusion step that was performed after the ion implantation is left above the silicon channel-forming region 806 after being subjected to thickness control, to serve as a gate insulating film. Numeral 807 denotes a gate electrode constituted of a polysilicon film having one type of conductivity.

The gate electrode 807 is covered with an insulating film 808 such as a silicon oxide film so as not to be short-circuited with a source electrode 809 or a drain electrode 810 (see FIG. 8A).

Once the state of FIG. 8A is obtained, an interlayer insulating film 811 is formed which is a silicon oxide film or a silicon nitride film. After a contact hole is formed through the interlayer insulating film 811, a lead-out line 812 for the drain electrode 810 is formed (see FIG. 8B).

Figure 8B:
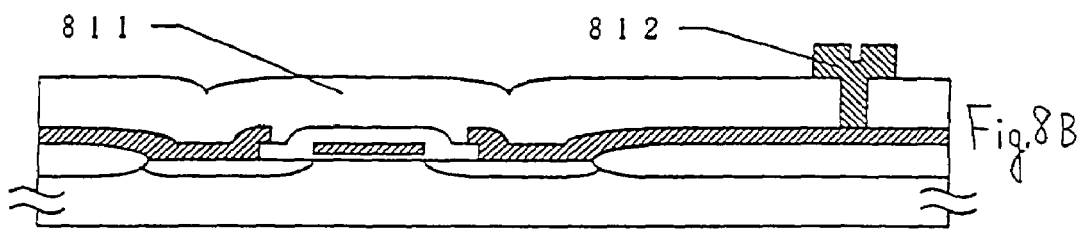

Once the state of FIG. 8B is obtained, the exposed surface is flattened by polishing such as CMP (chemical mechanical polishing), whereby the interlayer insulating film 811 is planarized and a protrusion of the lead-out line 812 is removed.

Figure 8C:
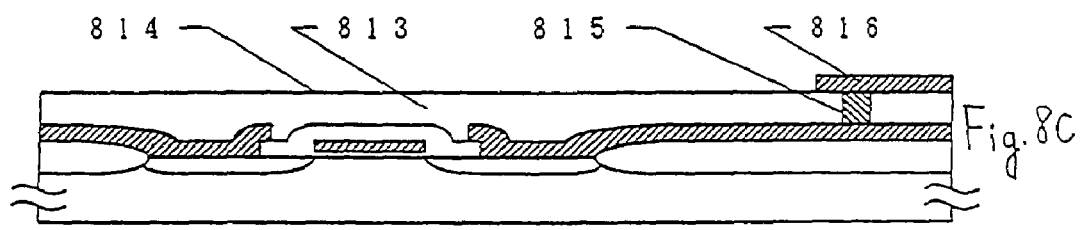

In FIG. 8C, reference numeral 813 denotes a planarized interlayer insulating film and 814 denotes its flat surface. Numeral 815 denotes a protrusion-removed lead-out line. A lead-out line 816 is so formed as to be connected to the lead-out line 815.

Subsequently, an interlayer insulating film 817 is formed. The invention can be implemented on the interlayer insulating film 817. That is, a thin-film transistor whose active layer is formed by using a monodomain region is formed on the interlayer insulating film 817.

First, an active layer 818 constituted of a monodomain region is formed according to the first embodiment. A gate insulating film 819 and a gate electrode 820 are sequentially formed thereon. Then, an impurity for imparting one type of conductivity is implanted into the active layer 818.

After completion of the impurity implantation, side walls 821 to be used for later formation of low-concentration impurity regions are formed by the following steps.

First, an insulating film (not shown) such as a silicon oxide film thicker than the gate electrode 820 is formed so as to cover it. When the insulating film is removed by anisotropic etching, i.e., dry etching, insulating films remain only on the side faces of the gate electrode 820.

Impurity implantation is again performed in this state. As a result, regions that have been doped with an impurity second time become source and drain regions, whereas regions shielded by side walls 821 become low-concentration impurity regions having a lower concentration than the source and drain regions. After the impurity implantation, the impurity is activated by a heat treatment, illumination with laser light, or a like treatment.

Once the active layer is constructed in the above manner, an interlayer insulating film 822 such as a silicon oxide film or a silicon nitride film is formed. After contact holes are formed through the interlayer insulating film 822, a source electrode 823 and a drain electrode 824 are formed.

Figure 8D:
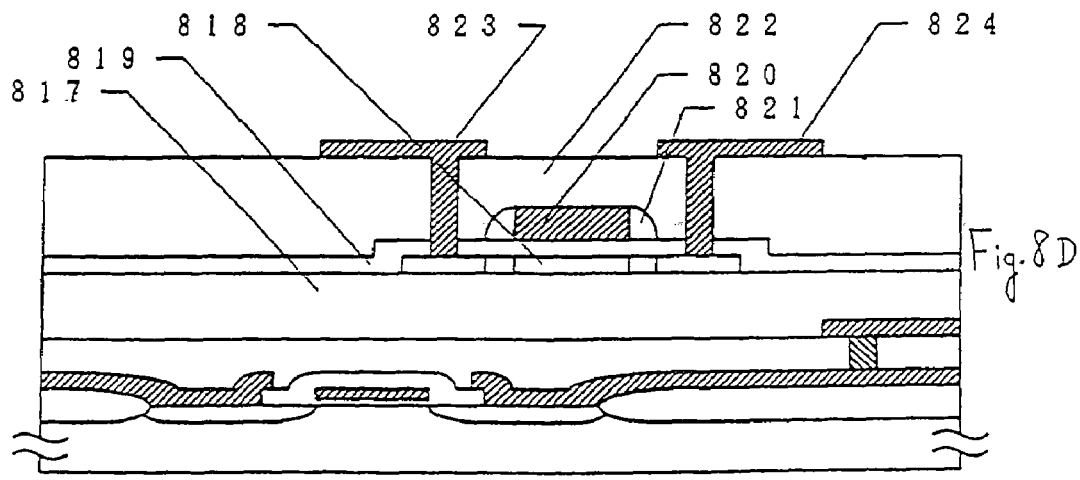

By implementing the invention above the IC as described in this embodiment, an integrated circuit having a three-dimensional structure as shown in FIG. 8D can be realized. Since the TFT formed above the IC exhibits performance which is equivalent to that of a TFT formed on a single crystal, the invention can realize an integrated circuit having a higher density than conventional ones without impairing the performance of the IC itself.

Embodiment 7

This embodiment is directed to a case where a TFT that is formed according to the invention is applied to a DRAM (dynamic random access memory). This embodiment will be described with reference to FIGS. 9A and 9B.

Figure 9A:
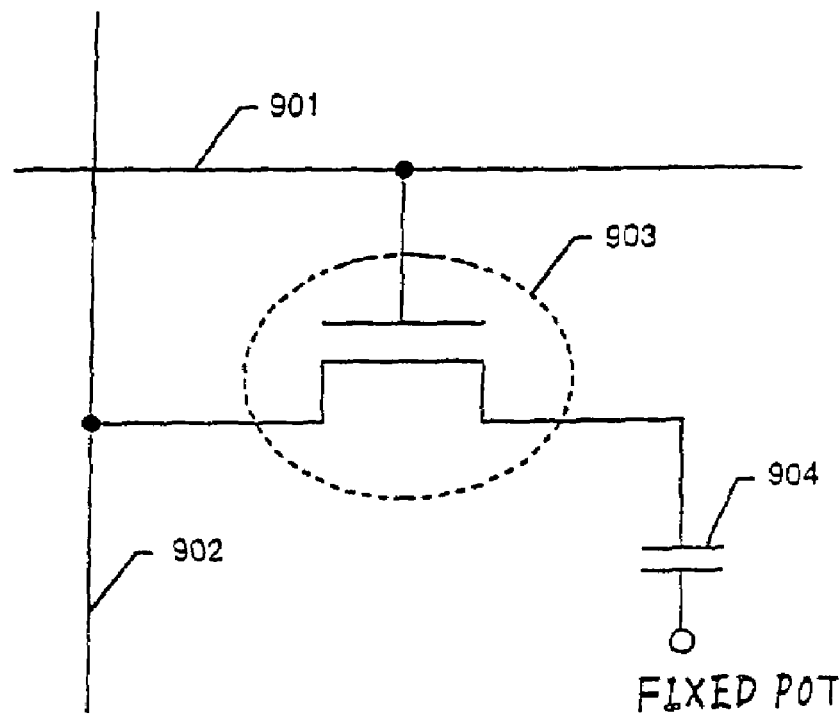
FIGS. 9A and 9B show the configuration of a DRAM according to a seventh embodiment of the invention.

The DRAM is a memory in which information is stored in a capacitor in the form of electric charge. Input and output of charge as information to and from the capacitor is controlled by a TFT that is connected in series to the capacitor. FIG. 9A shows a circuit including a TFT and a capacitor which circuit constitutes one memory cell of a DRAM.

When given a gate signal from a word line 901, a TFT 903 is rendered conductive. In this state, information is written when charge is supplied to the capacitor 904 from a bit line 902, or information is read by taking out charge from the capacitor 904.

Figure 9B:
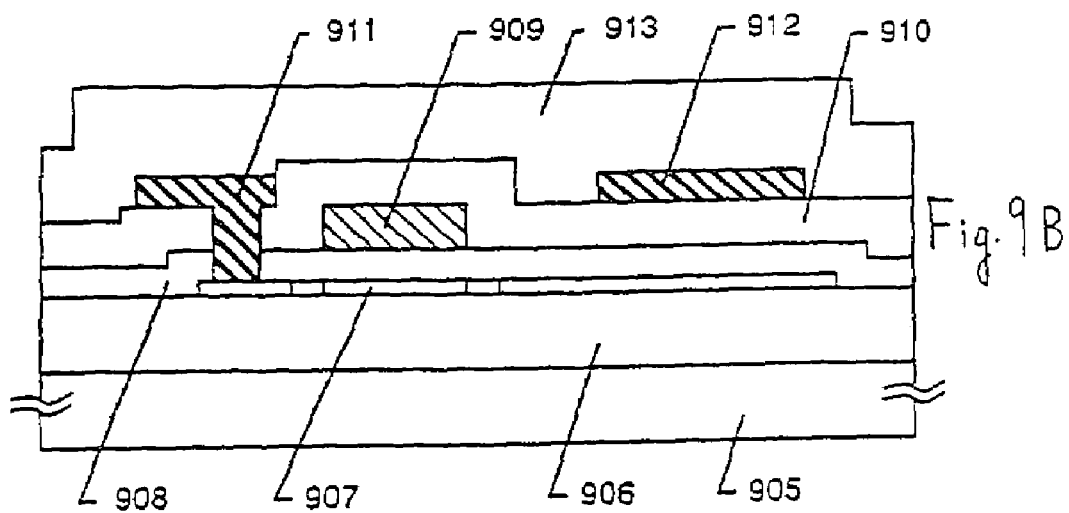

FIG. 9B shows a cross-section of the DRAM. Reference numeral 905 denotes a substrate such as a quartz substrate or a silicon substrate. In the case of a silicon substrate, what is called an SOI structure can be constructed.

A silicon oxide film 906 as an undercoat film is formed on the substrate 905 and a TFT according to the invention is formed thereon. If the substrate 905 is a silicon substrate, a thermal oxidation film can be used as the undercoat film 906. Reference numeral 907 denotes an active layer constituted of a monodomain region that is formed according to the first embodiment of the invention.

The active layer 907 is covered with a gate insulating film 908 and a gate electrode 909 is formed thereon. After an interlayer insulating film 910 is laid on the above structure, a source electrode 911 is formed through the interlayer insulating film 910. The bit line 902 and an electrode 912 are formed at the same time as the source electrode 911. Reference numeral 913 denotes an insulating film as a protection film.

The capacitor 904 is formed between the electrode 912 and the drain region of the active layer 907 located under the electrode 912. A fixed voltage is applied to the electrode 912. The DRAM operates as a storage device such that charge is written to or read from the capacitor 904 by means of the TFT.

The DRAM is suitable for constituting a highly integrated, large-scale memory because it consists of a very small number of elements: only a TFT and a capacitor. With an additional advantage of a low price, currently the DRAM is used most widely.

For example, in the case of an SOI structure in which the invention is implemented on a silicon substrate, the leak current of the TFT can be made small because of a small junction area. This greatly contributes to increase in data holding time.

Further, a DRAM cell formed on an SOI substrate has a feature that the storage capacitance can be made small. This enables low-voltage operation.

Embodiment 8

Figure 10A:
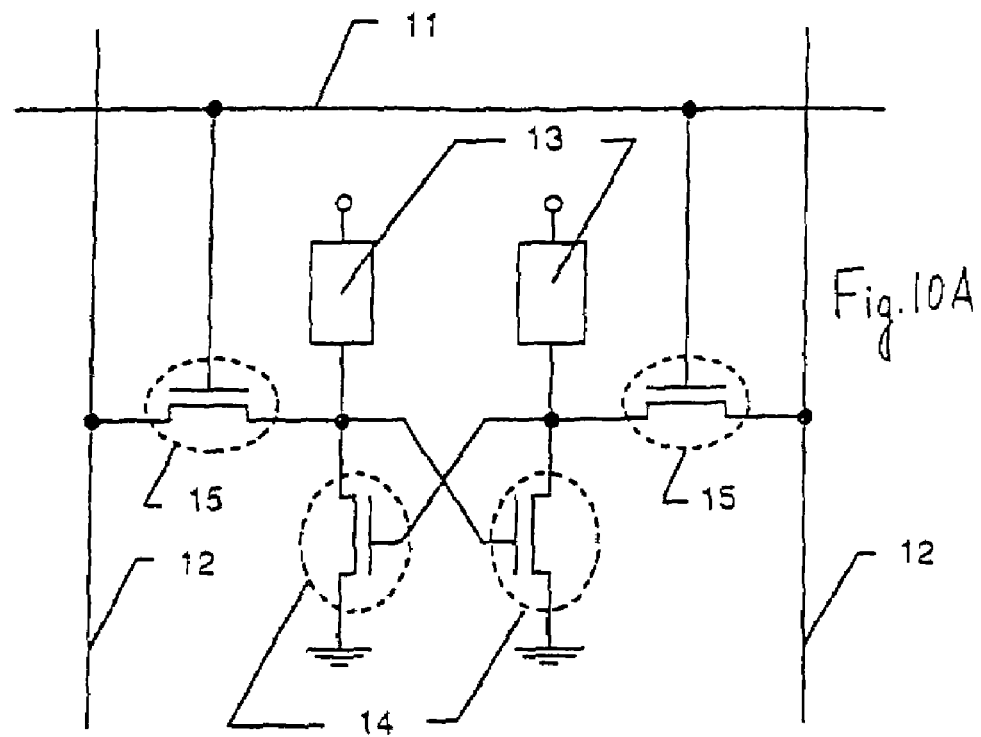
FIGS. 10A and 10B show the configuration of an SRAM according to an eighth embodiment of the invention.

This embodiment is directed to a case where a TFT that is formed according to the invention is applied to an SRAM (static random access memory). This embodiment will be described with reference to FIGS. 10A and 10B.

The SRAM is a memory in which a bistable circuit such as a flip-flop is used as a storage element. The SRAM stores binary information value (0 or 1) by using two stables states (on-off and off-on) of the bistable circuit. The SRAM is advantageous in being capable of holding data as long as it is supplied with power.

The storage circuit is constituted by an N-MOS or C-MOS circuit. In an SRAM shown in FIG. 10A, high-resistance resistors are used as passive load elements.

Reference numerals 11 and 12 denote a word line and a bit line, respectively. Load elements 13 are high-resistance resistors. A pair of driver transistors 14 and a pair of access transistors 15 are also provided.

Figure 10B:
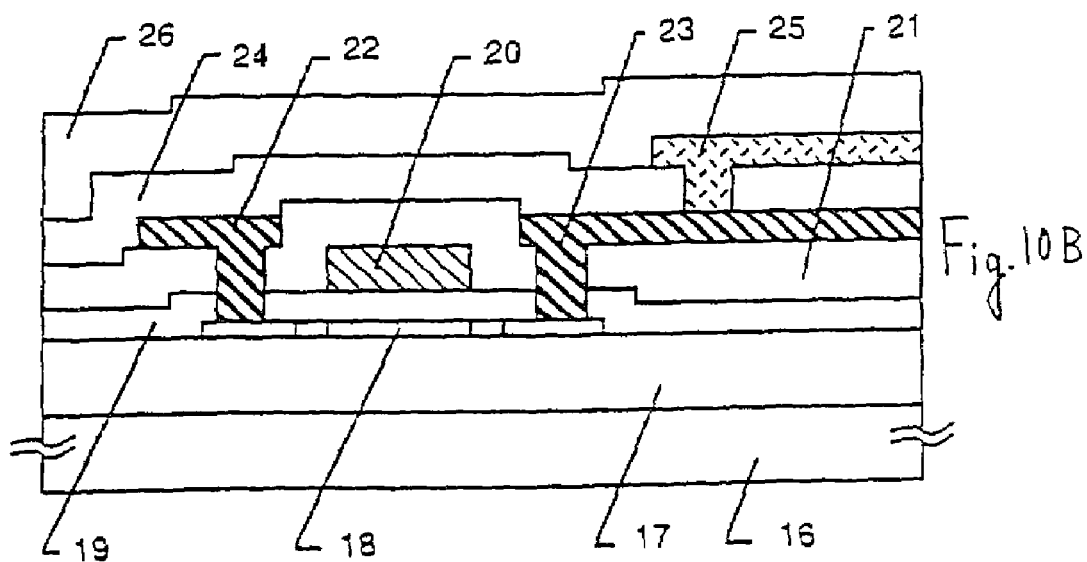

FIG. 10B shows a cross-section of a TFT. A silicon oxide film 17 as an undercoat film is formed on a substrate 16 which is a quartz or silicon substrate, and a TFT according to the invention is formed thereon. Reference numeral 18 denotes an active layer constituted of a monodomain region that is formed according to the first embodiment of the invention.

The active layer 18 is covered with a gate insulating film 19 and a gate electrode 20 is formed thereon. After an interlayer insulating film 21 is laid on the above structure, a source electrode 22 is formed through the interlayer insulating film 21. The bit line 12 and a drain electrode 23 are formed at the same time as the source electrode 22.

After an interlayer insulating film 24 is laid on the above structure, a polysilicon film 25 as a high-resistance load is formed thereon. Reference numeral 26 denotes an insulating film as a protection film.

The above-configured SRAM has advantages of high-speed operation and high reliability. Further, it can easily be incorporated into a system.

Embodiment 9

In recent years, studies on the SOI structure as described in the seventh and eighth embodiments have been made extensively in efforts to find a breakthrough for reduction in power consumption. In this embodiment, the invention is compared with problems associated with the SOI substrate.

Figure 11:
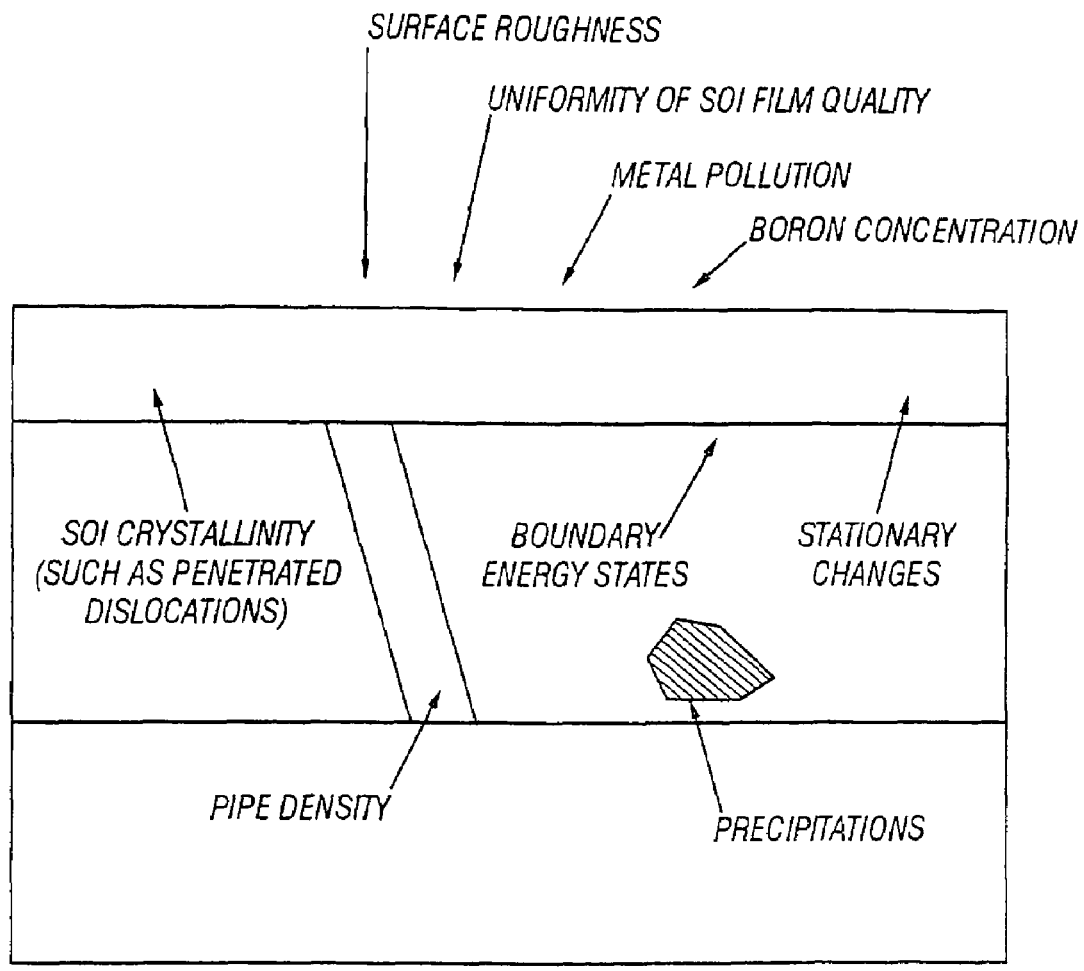
FIG. 11 show problems of an SOI structure.

FIG. 11 summarizes those problems. As shown in FIG. 11, there are crystallinity-problems such as boundary energy states and stationary charges in a silicon film and externally introduced problems such as metal pollution and a boron concentration.

In the invention, the crystallinity is improved and crystals are combined (single-crystallization) by illuminating a crystalline silicon film with laser light or strong light having equivalent energy.

This laser annealing has effects of eliminating or sufficiently reducing the factors that adversely affect the crystallinity, such as pipe density, boundary energy states, stationary charges, and penetrated dislocations.

Further, a precipitation as shown in FIG. 11 easily melts and disappears upon illumination with laser light if it is a silicide-type substance. If the precipitation is an oxide-type substance, it is expected that the precipitation disappears as oxygen is removed and diffused by a local temperature increase due to illumination with laser light.

Embodiment 10

This embodiment is directed to a case where an active matrix area and peripheral driver circuits for driving the active matrix area are integrated on the same substrate by using the semiconductor device of the third embodiment and the CMOS structure of the fourth embodiment.

One substrate of an integrated active matrix liquid crystal display device has the following configuration. In an active matrix area, at least one switching thin-film transistor is provided for each of pixels arranged in matrix form. Peripheral driver circuits for driving the active matrix area are disposed around the active matrix area. All of these circuits are integrated on a single glass substrate (or a quartz or silicon substrate).

If the invention is applied to the above configuration, the active matrix area and the peripheral driver circuits can be formed by using thin-film transistors whose performance is equivalent to that of MOS-FETs formed on a single crystal.

More specifically, each pixel TFT of the active matrix area is constituted by the thin-film transistor of FIG. 3 and the peripheral driver circuits are formed by using the CMOS structure of FIGS. 5A-5E, 6A-6D, and 7A-7B.

A thin-film transistor of the active matrix area is required to have as small an off-current as possible, because it needs to allow charge to be held by a pixel electrode for a given period.

Since a thin-film transistor according to the invention has an active layer which is constituted of a monodomain region, there are substantially no grain boundaries which could be a path along which an off-current flows preferentially. Therefore, according to the invention, thin-film transistors having small off-current can be provided in the active matrix area.

On the other hand, a CMOS circuit is commonly used in the peripheral driver circuits. To improve the characteristics of the peripheral driver circuits, it is necessary that differences in characteristics between an n-channel thin-film transistor and a p-channel thin-film transistor which constitute the CMOS circuit be minimized.

To this end, the CMOS structure of the fourth embodiment (FIGS. 5A-5E, 6A-6D, and 7A-7B) is most suitable.

In the above manner, the integrated active matrix liquid crystal display device can be obtained in which each circuit has desired characteristics.

Embodiment 11

This embodiment is directed to a case where in the third embodiment the gate insulating film is formed by different steps.

First, a semiconductor thin film including a monodomain region is formed by the same steps as in the first embodiment, and the active layer of a semiconductor device is formed by using only the monodomain region.

Next, an insulating film having silicon as a main component (a silicon oxide film in this embodiment) is formed at a thickness of 200-1,500 Å (800 Å in this embodiment) by a vapor-phase method as typified by CVD and PVD so as to cover the active layer. The thickness of the silicon oxide film may be determined in consideration of the dielectric breakdown voltage to be obtained finally. Instead of the silicon oxide film, a silicon oxynitride film or a silicon nitride film may be used.

Once the silicon oxide film is formed, a heat treatment is performed in an atmosphere containing a halogen element. The main object of this heat treatment is to remove, by gettering, metal substances such as nickel remaining in the active layer. The heat treatment may be conducted at 600° C.-1,100° C. To attain a sufficient gettering effect, it is desirable that the temperature be set higher than 700° C. (preferably 800° C.-1,000° C.).

Where a glass substrate is used, the heat treatment needs to be conducted at 600° C.-650° C. in view of its heat resistance. Where the substrate is highly heat-resistant as in the case of a quartz substrate, the upper limit temperature of the heat treatment can be increased to 1,100° C. (preferably 1,000° C.).

In this embodiment, a quartz substrate is used and the heat treatment is performed in an atmosphere containing hydrogen chloride (HCl) at 0.5-10% (3% in this embodiment) with respect to oxygen. If the HCl density is higher than the above range, the surface of the crystalline silicon film is roughened. The processing temperature and time are set at 950° C. and 0.5 hour, respectively.

An atmosphere containing a halogen element may be formed by adding, to an oxygen atmosphere, one or a plurality of gases selected from HCl, HF, HBr, $Cl_2$, $NF_3$, $F_2$, and $Br_2$.

As a result of this step, by virtue of the metal element gettering action of the halogen element, nickel is removed from the active layer to a concentration of less than $1 \times 10^{17}$ atoms/cm$^3$ (preferably less than $1 \times 10^{16}$ atoms/cm$^3$ and even preferably less than the spin concentration). These concentration values are measurement values obtained from a measurement result of SIMS (secondary ion mass spectrometry).

Thermal oxidation reaction proceeds at the boundary between the active layer and the silicon oxide film, so that a thermal oxidation film of about 200 Å in thickness is formed. To reduce the off-current, it is effective to set conditions so that the final thickness of the active layer becomes 200-300 Å (typically 250Å) In this embodiment, the film quality of the thermal oxidation film and the insulating film having silicon as a main component is improved by performing a heat treatment at 950° C. for about 1 hour in a nitrogen atmosphere after the heat treatment in the atmosphere containing a halogen element.

By the way, it is considered that nickel is segregated at grain boundaries of the crystalline silicon film that constitutes the active layer. After nickel is removed, many dangling bonds occur in grain boundaries. Those dangling bonds are recombined with each other by the heat treatment of 950° C., to form grain boundaries having few trap states and the like.

As a result of the heat treatment in the atmosphere containing a halogen element, the halogen element remains in the vicinity of the boundary between the active layer and the gate insulating film at a high concentration, which is $1 \times 10^{19}$ to $1 \times 10^{20}$ atoms/cm$^3$ according to a SIMS measurement.

Further, the thermal oxidation film that is formed at the boundary between the active layer and the silicon oxide film constitutes a gate insulating film together with the silicon oxide film. Since the number of defect energy states, interstitial silicon atoms, etc. at the boundary with the active layer is reduced when the thermal oxidation film is formed, much superior boundary conditions are established between the active layer and the gate insulating film.

As described above, the concentration of metal elements such as nickel can be reduced by performing the heat treatment of this embodiment. This is very important in terms of increase in the reliability of the semiconductor device. In addition, the crystal state of the active layer is improved, and a gate insulating film having superior boundary conditions can be formed.

As a result, it becomes possible to realize a semiconductor device having superior electrical characteristics and high reliability.

Embodiment 12

In this embodiment, attention is paid to improvement in conditions of the boundary between an active layer and a gate insulating film. In particular, this embodiment is effective when a glass substrate is used.

First, a semiconductor thin film including a monodomain region is formed by the same steps as in the first embodiment, and the active layer of a semiconductor device is formed by using only the monodomain region. Then, a silicon oxide film is formed at a thickness of 200-1,500 Å by CVD and PVD in the same manner as in the eleventh embodiment.

In this state, a heat treatment is performed at 500° C.-700° C. (typically 640° C.-650° C.). This temperature range is set to form a thermal oxidation film without causing strain in the glass substrate or warping it. This heat treatment may be performed in an atmosphere of only oxygen, or an atmosphere containing a halogen element, or even a wet atmosphere containing water vapor.

Where the heat treatment is performed under the conditions of this embodiment, a thermal oxidation film of tens of angstrom (for instance, 10-90 Å) in thickness is formed in 0.5-2 hours. The growth of the thermal oxidation film tends to end up with a thickness approximately within the above range.

According to the knowledge of the inventors, stationary charges, defect energy states, etc. are concentrated in the vicinity of the boundary between the active layer and the gate insulating film (in a region of 10-30 Å in thickness extending from the boundary toward both of the active layer side and the gate insulating layer side), and hence it is not an overstatement that this region determines the conditions of the boundary between the active layer and the gate insulating film.

Therefore, the conditions of the boundary between the active layer and the gate insulating film can be improved by thermally oxidizing the region of the active layer in the vicinity of the boundary which region is as thin as 10-30 Å (the thickness of the active layer is decreased by 10-30 Å while a new thermal oxidation film of 20-60 Å in thickness is formed), thereby eliminating stationary charges, defect energy states, etc. In other words, to provide superior boundary conditions, it is sufficient to form a thermal oxidation film that is as thin as tens of angstrom.

By incorporating the thermal oxidation step of this embodiment, a semiconductor device having superior characteristics can be formed on a substrate that is low in heat resistance, such as a glass substrate.

Embodiment 13

This embodiment is directed to a case where a crystalline silicon film (polysilicon film) is used as a gate electrode. This embodiment will be described with reference to FIGS. 13A-13D.

In FIG. 13A, reference numeral 1301 denotes a glass substrate; 1302, an undercoat film; 1303, an active layer constituted of a monodomain region which layer is obtained by the process of the first embodiment; 1304, a gate insulating film; and 1305, a gate electrode constituted of a polysilicon film that is given one type of conductivity.

Next, impurity ions for imparting one type of conductivity are implanted into the active layer 1303, so that impurity regions 1306 and 1307 are formed.

Upon completion of the impurity ion implantation, a silicon nitride film 1308 is formed at a thickness of 0.5-1 μm by low-pressure thermal CVD, plasma CVD, or sputtering. Instead of the silicon nitride film, a silicon oxide film may be formed.

Thus, the state of FIG. 13B is obtained. In this state, the silicon nitride film 1308 is etched to leave silicon nitride films only on the side faces of the gate electrode 1305 (etch-back method). The residual silicon nitride films serve as side walls 1309.

At this time, the gate insulating film 1304 is removed except portions masked by the gate electrode 1305 and the side walls 1309, as shown in FIG. 13C.

In this state, impurity ions are again implanted at a higher dose than in the previous impurity ion implantation. Since no impurity ions are implanted into regions 1310 and 1311 located right under the side walls 1309, the impurity concentration does not change there. However, impurity ions are further implanted into exposed regions 1312 and 1313 at a high dose.

As a result of the second ion implantation, a source region 1312, a drain region 1313, and low-concentration impurity regions 1310 and 1311 having a lower impurity concentration than the source and drain regions 1312 and 1313 are formed. The region 1311 is called an LDD region. A undoped region 1314 right under the gate electrode 1305 becomes a channel-forming region.Å

Thus, the state of FIG. 13C is obtained. In this state, a 300 Å Thick titanium film (not shown) is formed, whereupon the silicon film reacts with the titanium film. After the titanium film is removed, a heat treatment is performed by lamp annealing or the like, so that titanium silicide films 1315-1317 are formed on the exposed surfaces of the source and drain regions 1312 and 1313 and the gate electrode 1305 (see FIG. 13D).

Instead of the titanium film, a tantalum film, a tungsten film, a molybdenum film, or the like may be used.

Subsequently, after a 5,000 Å thick silicon oxide film is formed as an interlayer insulating film 1318, a source line 1319, a drain line 1320, and a gate line 1321 are formed. Thus, a TFT is completed which has a structure as shown in FIG. 13D.

In the TFT of this embodiment, good ohmic contact is attained because the wiring lines are connected to the TFT via the titanium silicide films 1315-1317.

Embodiment 14

The term "semiconductor devices" as used in this specification broadly means devices that operate on a semiconductor, and encompasses active matrix electro-optical devices (liquid crystal display devices, EL display devices, EC display devices, etc.) as configured according to the tenth embodiment and even application products incorporating such electro-optical devices.

This embodiment is directed to examples of such application products. Examples of semiconductor devices utilizing the invention include a TV camera, a head-mount display, a car navigation device, a projection display (front and rear types), a video camera, and a personal computer. Those devices will be briefly described with reference to FIGS. 14A-14F.

Figure 14A:
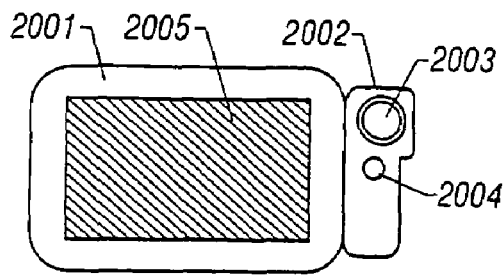
FIGS. 14A-14F illustrate examples of application products.

FIG. 14A shows a mobile computer, which is composed of a main body 2001, a camera section 2002, an image receiving section 2003, an operation switch 2004, and a display device 2005. The invention is applied to the display device 2005 and integrated circuits etc. incorporated in the device.

Figure 14B:
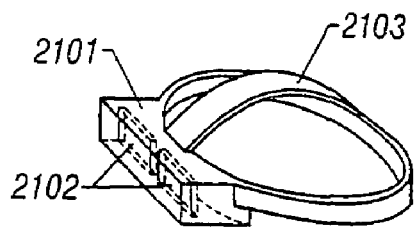

FIG. 14B shows a head-mount display, which is composed of a main body 2101, display devices 2102, and a band section 2103. The two display devices 2102 are used which are relatively small in size.

Figure 14C:
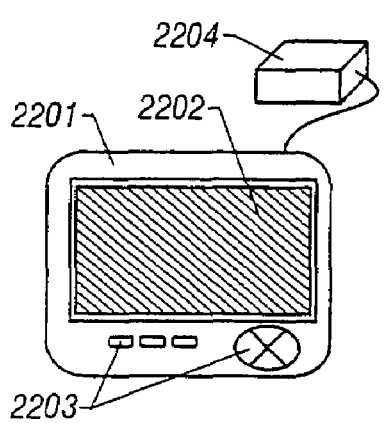

FIG. 14C shows a car navigation device, which is composed of a main body 2201, a display device 2202, operation switches 2203, and an antenna 2204. The invention is applied to the display device 2202 and integrated circuits etc. incorporated in the device. The display device 2202 is used as a monitor. Since the display device 2202 is mainly used for display of a map, the allowable range of resolution is relatively wide.

Figure 14D:
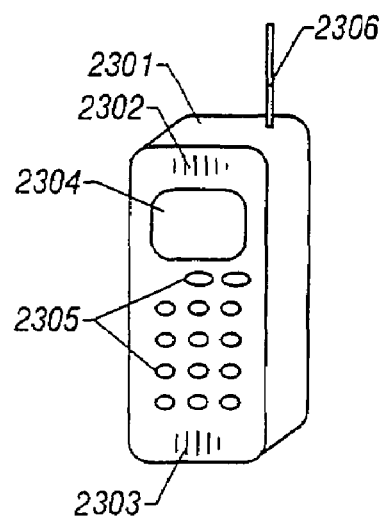

FIG. 14D shows a cellular telephone (handy telephone) set, which is composed of a main body 2301, a voice output section 2302, a voice input section 2303, a display device 2304, operation switches 2305, and an antenna 2306. The invention is applied to the display device 2304 and integrated circuits etc. incorporated in the device.

Figure 14E:
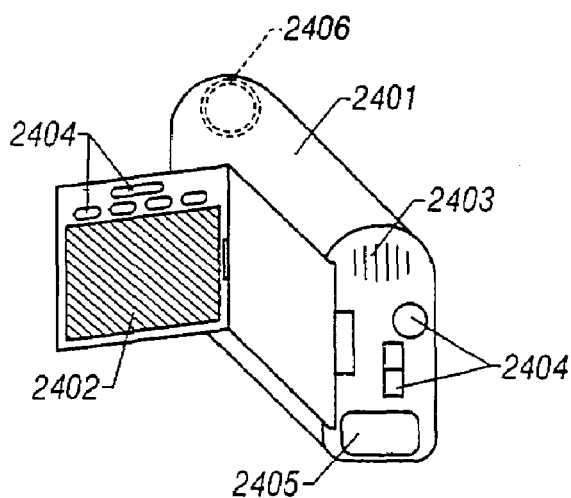

FIG. 14E shows a video camera, which is composed of a main body 2401, a display device 2402, a voice input section 2403, operation switches 2404, a battery 2405, and an image receiving section 2406. The invention is applied to the display device 2402 and integrated circuits etc. incorporated in the device.

Figure 14F:
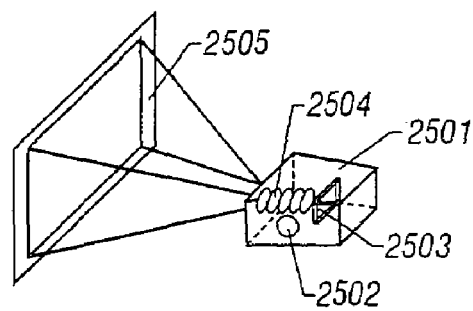

FIG. 14F shows a front-projection display, which is composed of a main body 2501, a light source 2502, a reflection-type display device 2503, an optical system (including a beam splitter, a polarizer, etc.) 2504, and a screen 2505. Since the screen 2505 is a large one which is used for presentation in a conference or a society meeting, the display device 2503 is required to have high resolution.

In addition to the above electro-optical devices, the invention can be applied to a rear-projection display and a portable information terminal such as a handy terminal. As such, the application range of the invention is very wide; the invention can be applied to display media in every field.

As for the advantages of the invention, a monodomain region which can substantially be regarded as a single crystal can be formed on a substrate having an insulating surface. The active layer of a semiconductor device such as a thin-film transistor can be formed by using a crystalline silicon film whose crystallinity is equivalent to that of a single crystal.

As a result, a semiconductor circuit whose performance is equivalent to that of an integrated circuit using a known single crystal wafer can be realized.

What is claimed is:

1. A semiconductor device having at least a static random access memory, the static random access memory comprising:
   a word line over a substrate;
   a first bit line intersecting perpendicularly to the word line, over the substrate;
   a first driver thin film transistor and a second driver thin film transistor over the substrate; and
   a first load element and a second load element over the substrate,
   wherein a gate electrode of the first driver thin film transistor is connected to a source or drain region of the second driver thin film transistor and the second load element,
   wherein a gate electrode of the second driver thin film transistor is connected to a source or drain region of the first driver thin film transistor and the first load element, and electrically connected to the first bit line,
   wherein each of the first and second driver thin film transistors comprises:
   a semiconductor film comprising a source region, a drain region, and a channel region between the source and drain regions;
   a gate electrode adjacent to the channel region with a gate insulating film interposed therebetween, and
   wherein the source and drain regions comprise metal silicide.

2. The semiconductor device having at least a static random access memory according to claim 1, wherein each of the first load element and the second load element is a resistor.

3. The semiconductor device having at least a static random access memory according to claim 1, wherein the static random access memory further comprising:
   a second bit line over the substrate;
   a third thin film transistor provided between the source or drain region of the first driver thin film transistor and the first bit line; and
   a fourth thin film transistor provided between the source or drain region of the second driver thin film transistor and the second bit line,
   wherein gate electrodes of the third thin film transistor and the fourth thin film transistor are connected to the word line.

4. The semiconductor device having at least a static random access memory according to claim 1, wherein each of the first and second driver thin film transistors includes crystalline silicon extended in parallel with the substrate.

5. The semiconductor device having at least a static random access memory according to claim 1, wherein the source and drain regions comprise nickel silicide.

6. The semiconductor device having at least a static random access memory according to claim 1, wherein the semiconductor device is incorporated into an electronic appliance selected from the group consisting of a TV camera, a head-mount display, a car navigation, a projection display, a video camera, a personal computer, and cellular telephone.

7. A semiconductor device having at least a static random access memory, the static random access memory comprising:
   a word line over a substrate;
   a first bit line intersecting perpendicularly to the word line, over the substrate; and
   at least a first thin film transistor and a second thin film transistor over the substrate;
   wherein a gate electrode of the first thin film transistor is connected to a source or drain region of the second thin film transistor,
   wherein a gate electrode of the second thin film transistor is connected to a source or drain region of the first thin film transistor, and electrically connected to the first bit line,
   each of the first and second thin film transistors comprising:
   a semiconductor film comprising a source region, a drain region, and a channel region between the source and drain regions, formed on an insulating film;
   a gate electrode adjacent to the channel region with a gate insulating film interposed therebetween,
   wherein the source and drain regions comprise metal silicide, and
   wherein the insulating film has at least one asperity of less than 30 Å in height on the upper surface thereof.

8. The semiconductor device having at least a static random access memory according to claim 7, wherein the static random access memory further comprising:

a first resistor connected to the source or drain region of the first thin film transistor;

a second resistor connected to the source or drain region of the second thin film transistor.

9. The semiconductor device having at least a static random access memory according to claim 7, wherein the static random access memory further comprising:

a second bit line over the substrate;

a third thin film transistor provided between the source or drain region of the first thin film transistor and the first bit line; and a fourth thin film transistor provided between the source or drain region of the second thin film transistor and the second bit line, wherein gate electrodes of the third and fourth thin film transistor are connected to the word line.

10. The semiconductor device having at least a static random access memory according to claim 7, wherein each of the first and second thin film transistors includes crystalline silicon extended in parallel with the substrate.

11. The semiconductor device having at least a static random access memory according to claim 7, wherein the source and drain regions comprise nickel silicide.

12. The semiconductor device having at least a static random access memory according to claim 7, wherein the semiconductor device is incorporated into an electronic appliance selected from the group consisting of a TV camera, a head-mount display, a car navigation, a projection display, a video camera, a personal computer, and a cellular telephone.

13. A semiconductor device having at least a static random access memory, the static random access memory comprising:

a word line over a substrate;

a first bit line intersecting perpendicularly to the word line, over the substrate;

a first driver thin film transistor and a second diver thin film transistor over the substrate; and a first load element and a second load element over the substrate, wherein a gate electrode of the first driver thin film transistor is connected to a source or drain region of the second driver thin film transistor and the second load element, wherein a gate electrode of the second driver thin film transistor is connected to a source or drain region of the first driver thin film transistor and the first load element, and electrically connected to the first bit line, wherein each of the first and second driver thin film transistors comprises:

a semiconductor film comprising a source region, a drain region, and a channel region between the source and drain regions;

a gate electrode formed over the channel region with a gate insulating film interposed therebetween; and a pair of sidewalls adjacent to side surfaces of the gate electrode, and wherein the source and drain regions include metal silicide.

14. The semiconductor device having at least a static random access memory according to claim 13, wherein each of the first load element and the second load element is a resistor.

15. The semiconductor device having at least a static random access memory according to claim 13, wherein the static random access memory further comprising:

a second bit line over the substrate;

a third thin film transistor provided between the source or drain region of the first driver thin film transistor and the first bit line; and a fourth thin film transistor provided between the source or drain region of the second driver thin film transistor and the second bit line, wherein gate electrodes of the third thin film transistor and the fourth thin film transistor are connected to the word line.

16. The semiconductor device having at least a static random access memory according to claim 13, wherein each of the first and second driver thin film transistors includes crystalline silicon extended in parallel with the substrate.

17. The semiconductor device having at least a static random access memory according to claim 13, wherein the source and drain regions comprise nickel silicide.

18. The semiconductor device having at least a static random access memory according to claim 13, wherein the semiconductor device is incorporated into an electronic appliance selected from the group consisting of a TV camera, a head-mount display, a car navigation, a projection display, a video camera, a personal computer, and a cellular telephone.

19. A semiconductor device having at least a static random access memory, the static random access memory comprising:

a word line over a substrate;

a first bit line intersecting perpendicularly to the word line, over the substrate;

a first driver thin film transistor and a second driver thin film transistor over the substrate; and a first load element and a second load element over the substrate, wherein a gate electrode of the first driver thin film transistor is connected to a source or drain region of the second driver thin film transistor and the second load element, wherein a gate electrode of the second driver thin film transistor is connected to a source or drain region of the first driver thin film transistor and the first load element, and electrically connected to the first bit line, wherein each of the first and second driver thin film transistors comprises:

a semiconductor film comprising a pair of LDD regions, a channel region formed between the pair of LDD regions, source and drain regions formed with the pair of LDD regions and the channel region interposed therebetween;

a gate electrode formed over the channel region with a gate insulating film interposed therebetween; and a pair of first sidewalls formed adjacent to side surfaces of the gate electrode, wherein the pair of sidewalls overlaps with the pair of LDD regions with the gate insulating film interposed therebetween, and wherein the source and drain regions include metal silicide.

20. The semiconductor device having at least a static random access memory according to claim 19, wherein each of the first load element and the second load element is a resistor.

21. The semiconductor device having at least a static random access memory according to claim 19, wherein the static random access memory further comprising:

a second bit line over the substrate;

a third thin film transistor provided between the source or drain region of the first driver thin film transistor and the first bit line; and a fourth thin film transistor provided between the source or drain region of the second driver thin film transistor and the second bit line, wherein gate electrodes of the third thin film transistor and the fourth thin film transistor are connected to the word line.

22. The semiconductor device having at least a static random access memory according to claim 19, wherein each of the first and second driver thin film transistors includes crystalline silicon extended in parallel with the substrate.

23. The semiconductor device having at least a static random access memory according to claim 19, wherein the source and drain regions comprise nickel silicide.

24. The semiconductor device having at least a static random access memory according to claim 19, wherein the semiconductor device is incorporated into an electronic appliance selected from the group consisting of a TV camera, a head-mount display, a car navigation, a projection display, a video camera, a personal computer, and a cellular telephone.

* * * * *